United States Patent
Raquibuzzaman et al.

(10) Patent No.: US 12,254,218 B2
(45) Date of Patent: Mar. 18, 2025

(54) READ SCHEMES WITH ADJUSTMENT FOR NEIGHBORING WORD LINE SANITIZATION

(71) Applicant: SanDisk Technologies LLC, Addison, TX (US)

(72) Inventors: Md Raquibuzzaman, Huntsville, AL (US); Sujjatul Islam, San Jose, CA (US); Ravi J. Kumar, Redwood City, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/360,252

(22) Filed: Jul. 27, 2023

(65) Prior Publication Data

US 2024/0143229 A1 May 2, 2024

Related U.S. Application Data

(60) Provisional application No. 63/419,600, filed on Oct. 26, 2022.

(51) Int. Cl.
*G06F 3/06* (2006.01)
(52) U.S. Cl.
CPC .......... *G06F 3/0659* (2013.01); *G06F 3/0604* (2013.01); *G06F 3/0679* (2013.01)
(58) Field of Classification Search
CPC ..... G06F 3/0659; G06F 3/0604; G06F 3/0679
See application file for complete search history.

(56) References Cited

U.S. PATENT DOCUMENTS

| | | | |
|---|---|---|---|
| 7,499,319 B2 | 3/2009 | Mokhlesi | |
| 2009/0164871 A1* | 6/2009 | Jo | G11C 29/42 |
| | | | 714/763 |
| 2011/0182119 A1 | 7/2011 | Strasser et al. | |
| 2013/0107640 A1* | 5/2013 | Yamada | G11C 8/08 |
| | | | 365/226 |
| 2014/0198567 A1 | 7/2014 | Mokhlesi | |
| 2016/0378656 A1* | 12/2016 | Kudo | G06F 12/0815 |
| | | | 711/143 |
| 2017/0200510 A1* | 7/2017 | Hung | G11C 29/24 |
| 2018/0053562 A1 | 2/2018 | Reuswig et al. | |
| 2019/0102097 A1* | 4/2019 | Madraswala | G11C 16/26 |
| 2019/0333586 A1* | 10/2019 | Park | G11C 16/10 |

(Continued)

OTHER PUBLICATIONS

Ahn, Na Young, and Dong Hoon Lee. "Forensics and anti-forensics of a NAND flash memory: From a copy-back program perspective." IEEE Access 9 (2021): 14130-14137. (Year: 2021).*

(Continued)

*Primary Examiner* — Nicholas J Simonetti
(74) *Attorney, Agent, or Firm* — Pearl Cohen Zedek Latzer Baratz LLP

(57) ABSTRACT

An apparatus includes a control circuit configured connect to non-volatile memory cells. The control circuit is configured to receive a read command directed to data stored in non-volatile memory cells of a first word line and determine that a second word line adjacent to the first word line is sanitized. The control circuit is further configured to select an adjusted read voltage for a read operation directed to the non-volatile memory cells of the first word line based on the determination.

20 Claims, 19 Drawing Sheets

(56) References Cited

U.S. PATENT DOCUMENTS

| | | |
|---|---|---|
| 2020/0005878 A1 | 1/2020 | Lu et al. |
| 2021/0134378 A1 | 5/2021 | Papandreou et al. |
| 2021/0375357 A1* | 12/2021 | Li .................. G06F 12/0246 |
| 2023/0176746 A1* | 6/2023 | Baldwin ............ G06F 12/0246 711/154 |
| 2023/0187009 A1* | 6/2023 | Xu .................. G06F 3/0679 711/154 |
| 2024/0071506 A1* | 2/2024 | Xu .................. G11C 29/021 |

OTHER PUBLICATIONS

Lin, Ping-Hsien, et al. "Achieving fast sanitization with zero live data copy for MLC flash memory." 2018 IEEE/ACM International Conference on Computer-Aided Design (ICCAD). IEEE, 2018. (Year: 2018).*

Diesburg, Sarah, et al., "TrueErase: Per-File Secure Deletion for the Storage Data Path," ACSAC' 12, Dec. 2012, 10 pages.

Jia, Shijie, et al., "NFPS: Adding undetectable secure deletion to flash translation layer," Proceedings of the 11th ACM Asia Conference on Computer and Communications Society, May 2016, 3 pages.

Lee, Jaeheung, et al., "Secure Deletion for NAND Flash File System," SAC' 08, Mar. 2008, 5 pages.

Zuolo, Lorenzo, et al., "Solid State Drives: Memory Driven Design Methodologies for optimal Performance," Proceedings of the IEEE, vol. 105, Issue 9, Sep. 2017, 19 pages.

Chen, Feng, et al., "Software Support Inside and Outside Solid State Devices for High Performance and High Efficiency," Proceedings of the IEEE, vol. 105, Issue 9, Sep. 2017, 15 pages.

Hasan, Md Mehedi, et al., "Data Recovery from "Scrubbed" NAND Flash Storage: Need for Analog Sanitization," Usenix—The Advanced Computing Systems Association, Aug. 2020, 11 pages.

Kim, Myungsuk, et al., "Evanesco: Architectural Support for Efficient Data Sanitization in Modern Flash-Based Storage Systems," ASPLOS'20, Mar. 2020, 16 pages.

Reardon, Joel, et al., "Data Node Encrypted File System: Efficient Secure Deletion for Flash Memory," Proceedings of the 21st USENIX conference on Security symposium, Aug. 2012, 16 pages.

Raquibuzzaman, Md, et al., "Instant Data Sanitization on Multi-Level-Cell NAND Flash Memory," Systor '22, Jun. 2022, 11 pages.

Chen, Bo, "HiFlash: A History Independent Flash Device," arXIV:1511.05180v1, Nov. 2015, 14 pages.

* cited by examiner

FIG. 7

| | States | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|---|
| T | 1,3,7,13 | 1 | 0 | 0 | 1 | 1 | 1 | 1 | 0 | 0 | 0 | 0 | 0 | 0 | 1 | 1 | 1 |
| U | 2,8,10,12 | 1 | 1 | 0 | 0 | 0 | 0 | 0 | 0 | 1 | 1 | 0 | 0 | 1 | 1 | 1 | 1 |
| M | 4,6,9,15 | 1 | 1 | 1 | 1 | 0 | 0 | 1 | 1 | 1 | 0 | 0 | 0 | 0 | 0 | 0 | 1 |
| L | 5,11,14 | 1 | 1 | 1 | 1 | 1 | 0 | 0 | 0 | 0 | 0 | 0 | 1 | 1 | 1 | 0 | 0 |
| Cell % Before | | 6.25 | 6.25 | 6.25 | 6.25 | 6.25 | 6.25 | 6.25 | 6.25 | 6.25 | 6.25 | 6.25 | 6.25 | 6.25 | 6.25 | 6.25 | 6.25 |
| Cell % after | | 0 | 0 | 0 | 0 | 0 | 0 | 0 | 0 | 0 | 0 | 0 | 0 | 0 | 0 | 0 | 100 |

| Stored bits | | | δV |
|---|---|---|---|
| 0 | 0 | 0 | 0.00 volts |
| 0 | 0 | 1 | 0.05 volts |
| 0 | 1 | 0 | 0.10 volts |
| 0 | 1 | 1 | 0.15 volts |
| 1 | 0 | 0 | 0.20 volts |
| 1 | 0 | 1 | 0.25 volts |
| 1 | 1 | 0 | 0.30 volts |
| 1 | 1 | 1 | 0.35 volts |

# READ SCHEMES WITH ADJUSTMENT FOR NEIGHBORING WORD LINE SANITIZATION

CLAIM OF PRIORITY

The present application claims priority from U.S. Provisional Patent Application No. 63/419,600, entitled "READ SCHEMES WITH ADJUSTMENT FOR NEIGHBORING WORD LINE SANITIZATION," by Raquibuzzaman et al., filed Oct. 26, 2022, incorporated by reference herein in its entirety.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at each end of the string. Typically, such strings are referred to as NAND strings. A NAND string may have a drain side select transistor at one end that connects the string to a bit line. A NAND string may have a source side select transistor at one end that connects the string to a source line. The non-volatile memory cells may also be referred to as non-volatile memory cell transistors, with the channels of the non-volatile memory cell transistors collectively being referred to as a NAND string channel.

BRIEF DESCRIPTION OF THE DRAWINGS

Like-numbered elements refer to common components in the different figures.

FIG. 7 illustrates an example of sanitizing QLC memory cells.

DETAILED DESCRIPTION

Techniques are provided for operating non-volatile memory arrays in which data may be deleted or destroyed by a sanitization operation directed to non-volatile memory cells of one or more target word lines. Sanitization allows a relatively small unit of data (e.g., less than a block) to be efficiently destroyed by increasing threshold voltages of memory cells from their programmed threshold voltage ranges to one or more threshold voltage range that does not correspond to programmed data. Increasing threshold voltage of memory cells along a target word line (e.g., by increasing the amount of charge in memory cells) may affect adjacent one or more adjacent word line. For example, threshold voltages of programmed memory cells immediately next to a target word line may be shifted. When memory cells of the adjacent word lines are subsequently read, the shifted threshold voltages may increase the number of bits that are misread and thus increase the number of errors in the data that is read.

In examples of the present technology, when memory cells located along a word line that is adjacent to a sanitized word line are read, an adjusted read voltage scheme is used. The adjusted read voltage scheme may be configured to give fewer errors than an unadjusted read voltage scheme. For example, one or more read voltage may be adjusted to be greater than a read voltage used to read other word lines that are not adjacent to a sanitized word line. When a word line is sanitized, a flag may be set to indicate that an adjacent word line should be read using an adjusted read voltage scheme. Subsequently, when a read command is received that is directed to the adjacent word line, the flag may be used to determine what read voltage scheme to use and the adjusted read voltage may be selected in response to the flag being set. An unadjusted read voltage scheme may be used for word lines for which a corresponding flag is not set. Aspects of the present technology address the technical problems of errors caused by sanitization of a neighboring word line. Aspects of the present technology provide solutions to such problems including adjusted read voltage schemes and a scheme of setting flags to track sanitized word lines.

Figure 1:
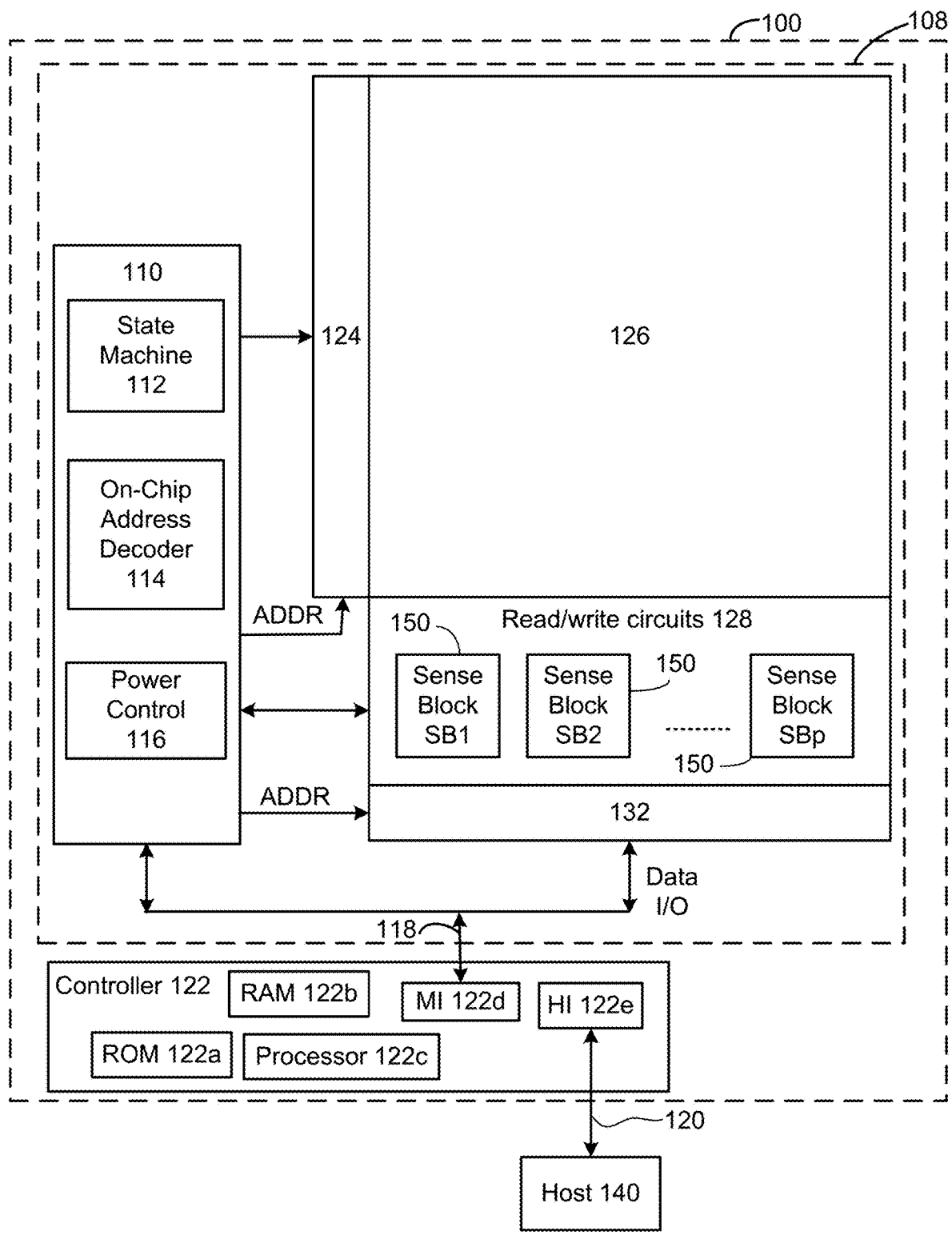
FIG. 1 (FIG. 1) is a functional block diagram of a memory device.

FIG. 1-FIG. 4D describe examples of memory systems that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuit 110, and read/write circuits 128. Memory structure 126 is addressable by word lines via a row decoder 124 and by bit lines via a column decoder 132. The read/write/erase circuits 128 include multiple sense blocks 150 including SB1, SB2, ..., SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuit 110 cooperates with the read/write circuits 128 to perform memory operations (e.g., write, read, erase and others) on memory structure 126, and includes state machine 112, an on-chip address decoder 114, and a power control circuit 116. In one embodiment, control circuit 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs various functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuit 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used. The exact type of memory array architecture or memory cell included in memory structure 126 is not limited to the examples above.

Figure 2A:
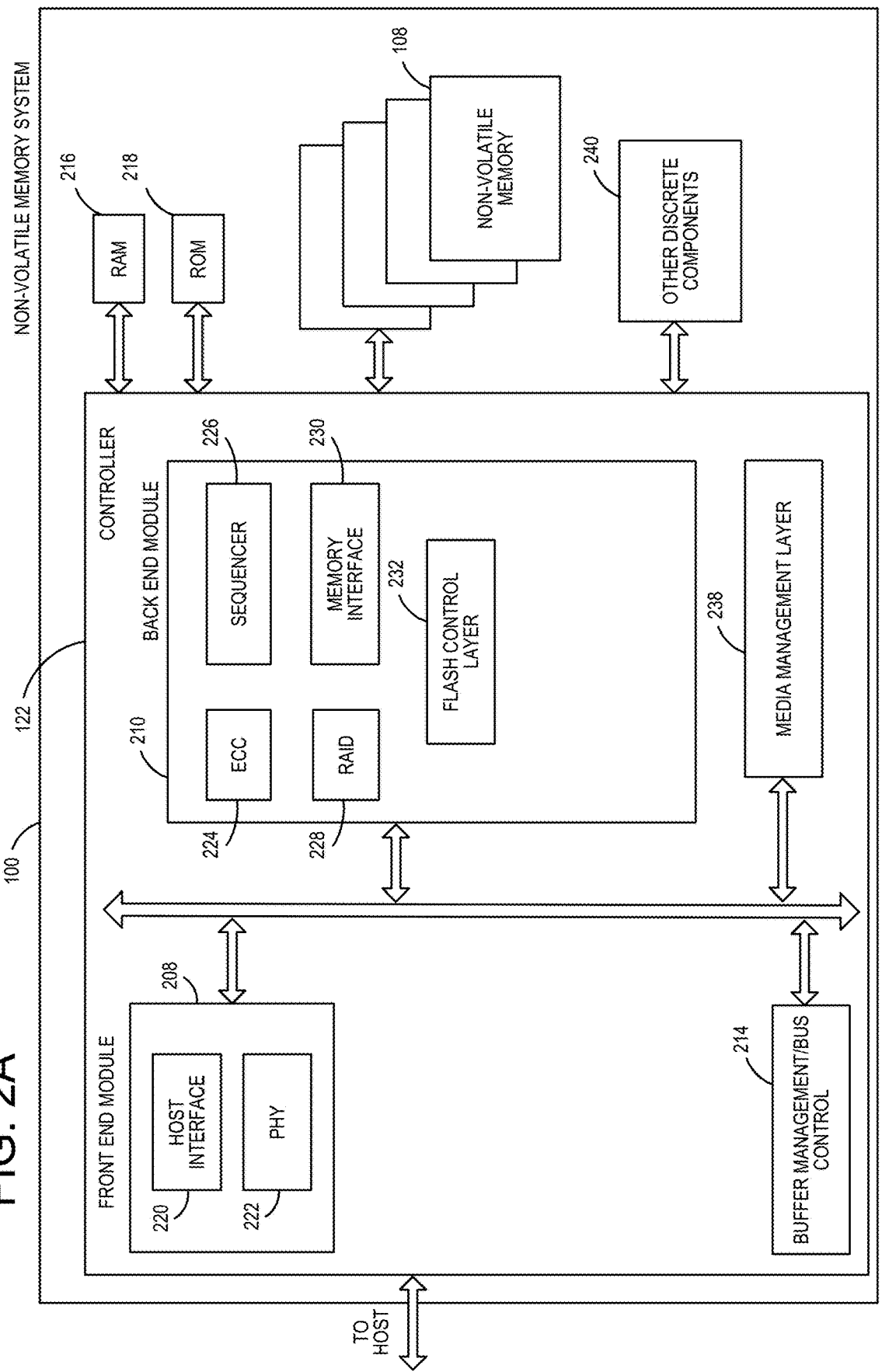
FIGS. 2A-B are block diagrams depicting embodiments of a memory system.

FIG. 2A is a block diagram of example memory system 100, depicting more details of one embodiment of controller 122. The controller in FIG. 2A is a flash memory controller but note that the non-volatile memory die 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2A, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2A may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2A is one example implementation that may (or may not) use the components of controller 122 depicted in FIG. 1 (i.e., RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2A as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g., as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of memory system 100 illustrated in FIG. 2A include media management layer 238, which performs wear leveling of memory cells of non-volatile memory die 108. Memory system 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of memory die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes into the memory 126.

Controller 122 may interface with one or more memory dies 108. In one embodiment, controller 122 and multiple memory dies (together comprising non-volatile memory system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

In one embodiment, the control circuit(s) (e.g., control circuits 110) are formed on a first die, referred to as a control die, and the memory array (e.g., memory structure 126) is formed on a second die, referred to as a memory die. For example, some or all control circuits (e.g., control circuit 110, row decoder 124, column decoder 132, and read/write circuits 128) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

Figure 2B:
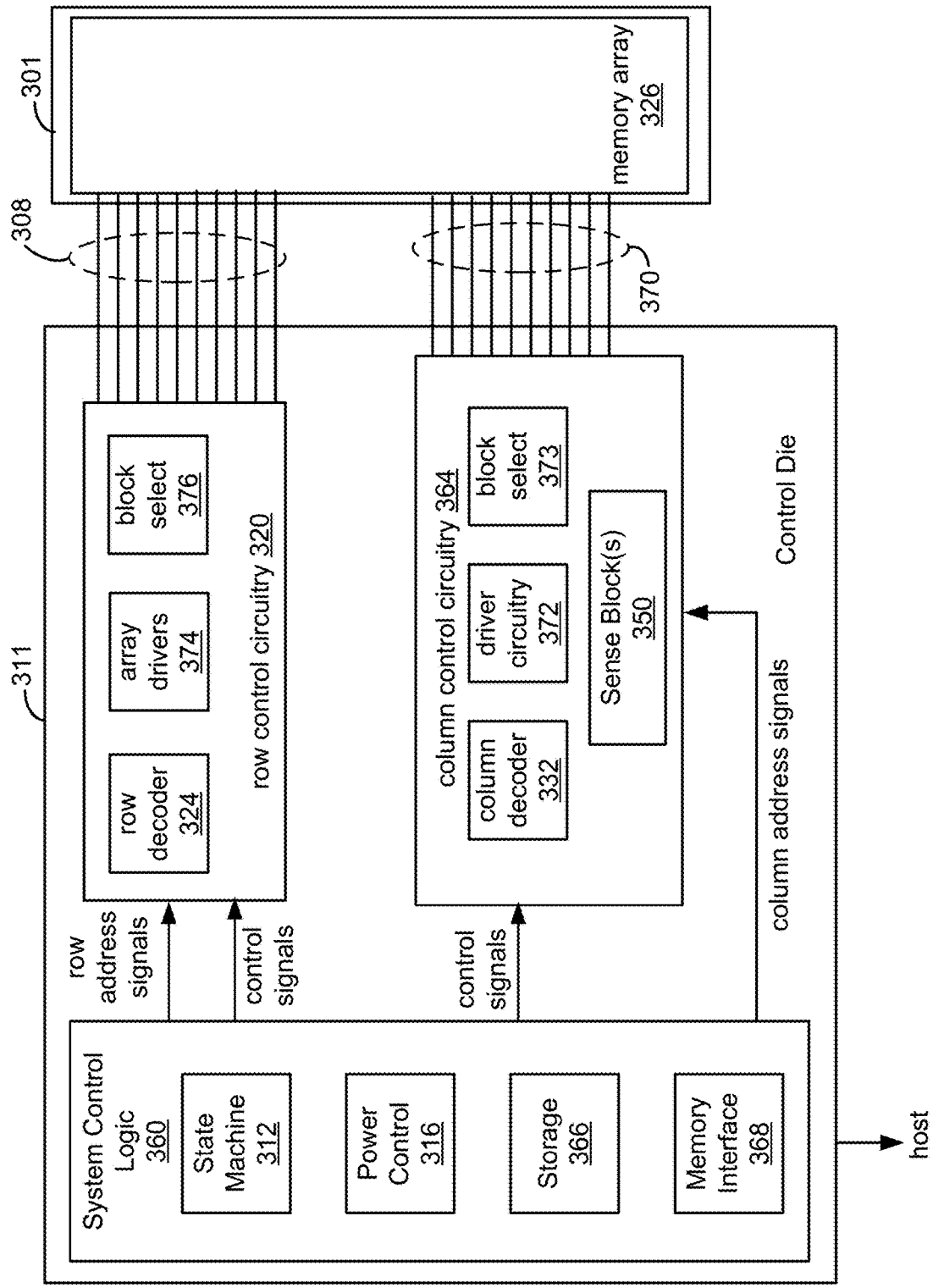

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package in memory system 100. The integrated memory assembly 307 includes two types of semiconductor die (or more succinctly, "die"). Memory die 301 includes memory array 326 (memory structure 326, which may be any suitable memory as described with respect to memory structure 126). Memory array 326 may contain non-volatile memory cells.

Control die 311 includes column control circuitry 364, row control circuitry 320 and system control logic 360 (including state machine 312, power control module 316, storage 366, and memory interface 368). In some embodiments, control die 311 is configured to connect to the memory array 326 in the memory die 301. FIG. 2B shows an example of the peripheral circuitry, including control circuits, formed in a peripheral circuit or control die 311 coupled to memory array 326 formed in memory die 301. System control logic 360, row control circuitry 320, and column control circuitry 364 are located in control die 311. In some embodiments, all or a portion of the column control circuitry 364 and all or a portion of the row control circuitry 320 are located on the memory die 301. In some embodiments, some of the circuitry in the system control logic 360 is located on the on the memory die 301.

System control logic 360, row control circuitry 320, and column control circuitry 364 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 364). Thus, while moving such circuits from a die such as memory die 301 may reduce the number of steps needed to fabricate such a die, adding such circuits to a die such as control die 311 may not require many additional process steps.

FIG. 2B shows column control circuitry 364 including sense block(s) 350 on the control die 311 coupled to memory array 326 on the memory die 301 through electrical paths 370. For example, electrical paths 370 may provide electrical connection between column decoder 332, driver circuitry 372, and block select 373 and bit lines of memory array (or memory structure) 326. Electrical paths may extend from column control circuitry 364 in control die 311 through pads on control die 311 that are bonded to corresponding pads of the memory die 301, which are connected to bit lines of memory structure 326. Each bit line of memory structure 326 may have a corresponding electrical path in electrical paths 370, including a pair of bond pads, which connects to column control circuitry 364. Similarly, row control circuitry 320, including row decoder 324, array drivers 374, and block select 376 are coupled to memory array 326 through electrical paths 308. Each of electrical path 308 may correspond to a word line, dummy word line, or select gate line. Additional electrical paths may also be provided between control die 311 and memory die 301.

In some embodiments, there is more than one control die 311 and/or more than one memory die 301 in an integrated memory assembly 307. In some embodiments, the integrated memory assembly 307 includes a stack of multiple control die 311 and multiple memory dies 301. In some embodiments, each control die 311 is affixed (e.g., bonded) to at least one of the memory dies 301.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
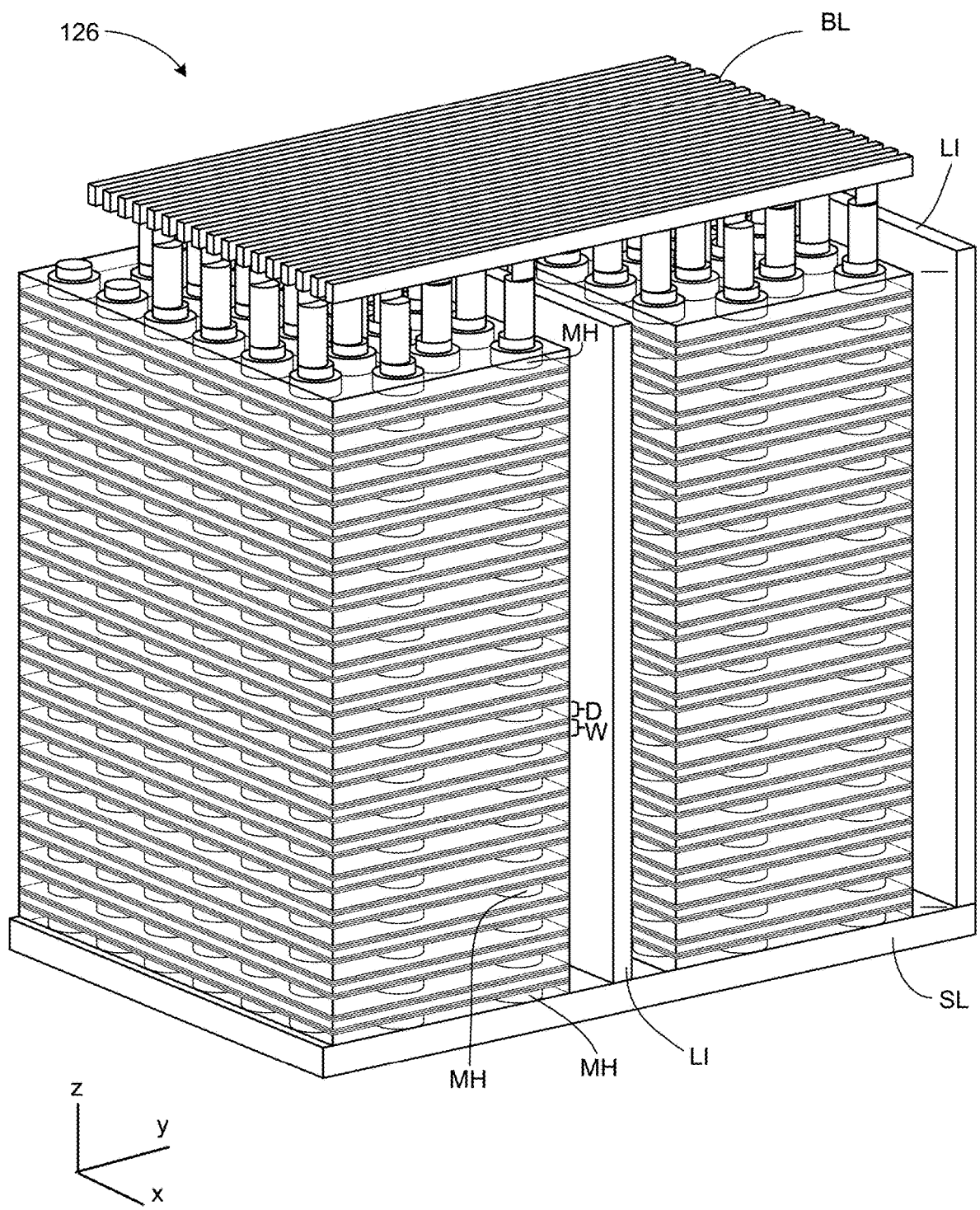
FIG. 3 is a perspective view of a portion of one embodiment of a monolithic three dimensional memory structure.

FIG. 3 is a perspective view of a portion of one example embodiment of a monolithic three dimensional memory array that can comprise memory structure 126 or 326, which includes a plurality non-volatile memory cells. For example, FIG. 3 shows a portion of one block of memory. The structure depicted includes a set of bit lines BL positioned above a stack of alternating dielectric layers and conductive layers. For example, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. Data word line layers have data memory cells. Dummy word line layers have dummy memory cells. As will be explained below, the alternating dielectric layers and conductive layers are divided into "fingers" in regions that are separated by local interconnects LI. FIG. 3 shows two regions, each with respective NAND strings, and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 or 326 are provided below with respect to FIGS. 4A-4D.

Figure 4A:
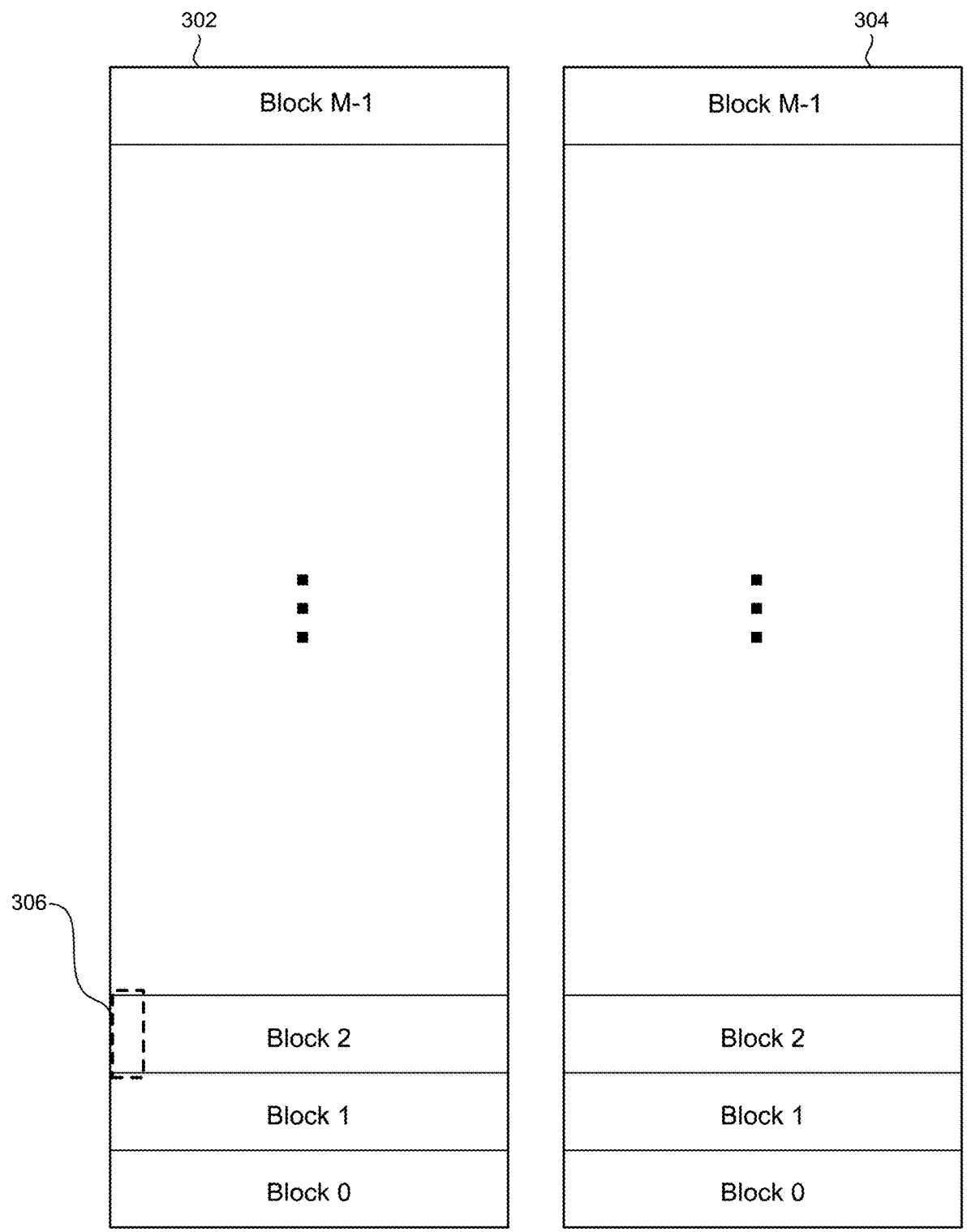
FIG. 4A is a block diagram of a memory structure having two planes.

FIG. 4A is a block diagram explaining one example organization of a memory structure (e.g., memory structure 126 or 326), which is divided into two planes 302 and 304. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines. Blocks may be connected by bit lines that are shared by multiple blocks.

Figure 4B:
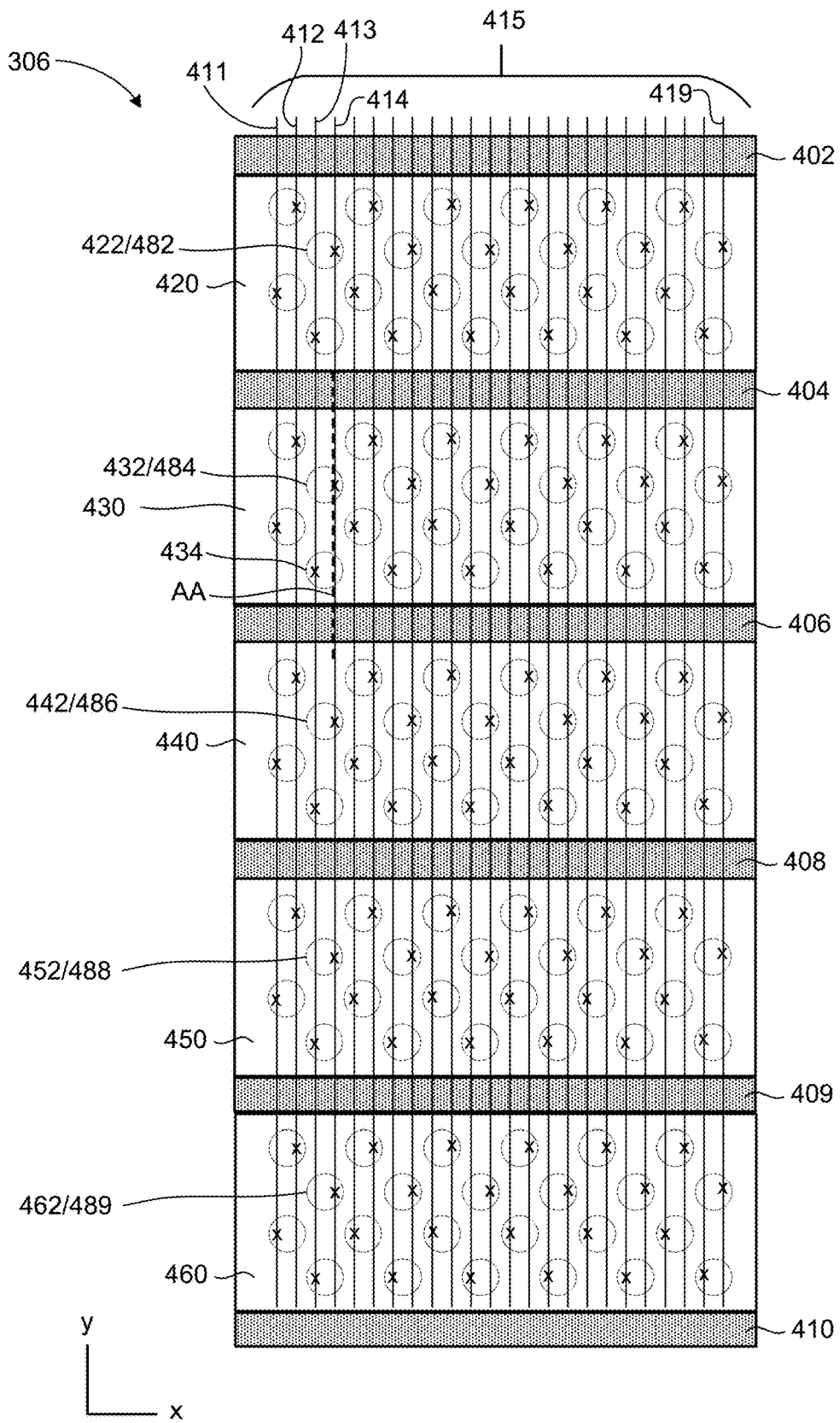
FIG. 4B depicts a top view of a portion of a block of memory cells.
Figure 4C:
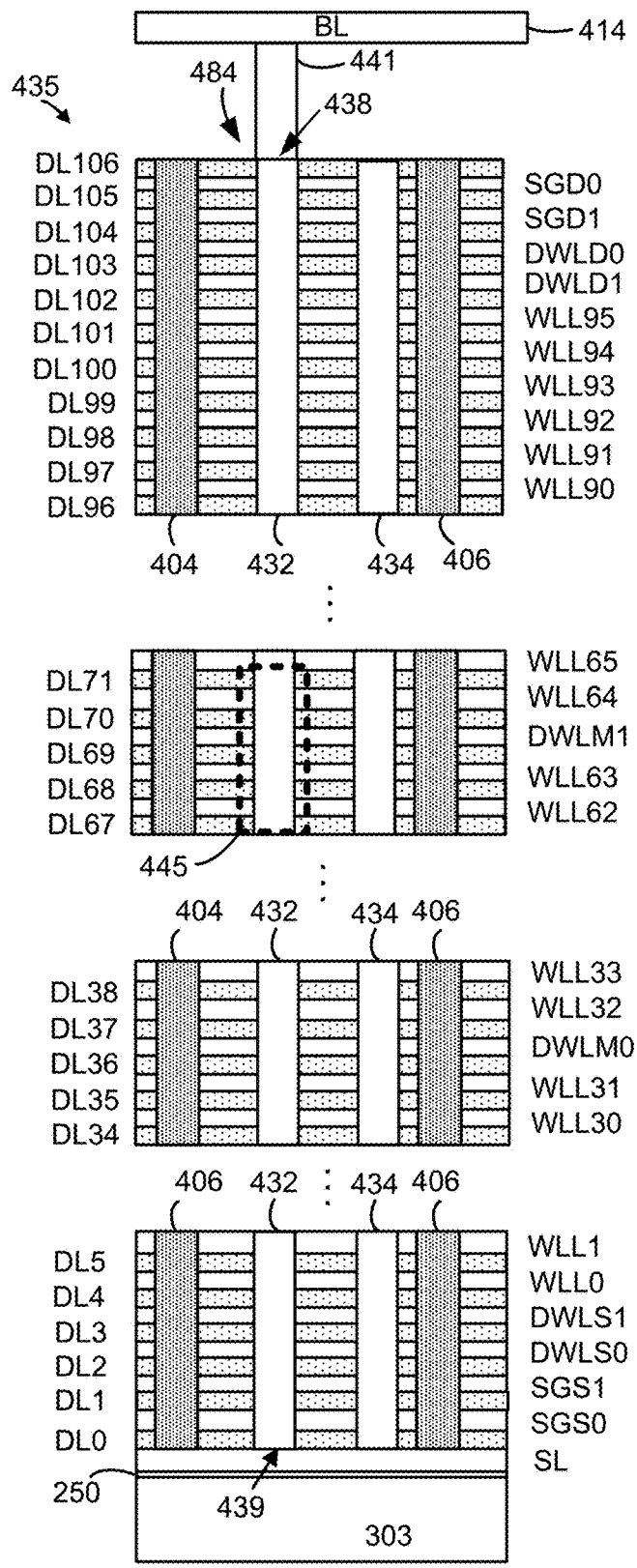
FIG. 4C depicts an embodiment of a stack showing a cross-sectional view along line AA of FIG. 4B.
Figure 4D:
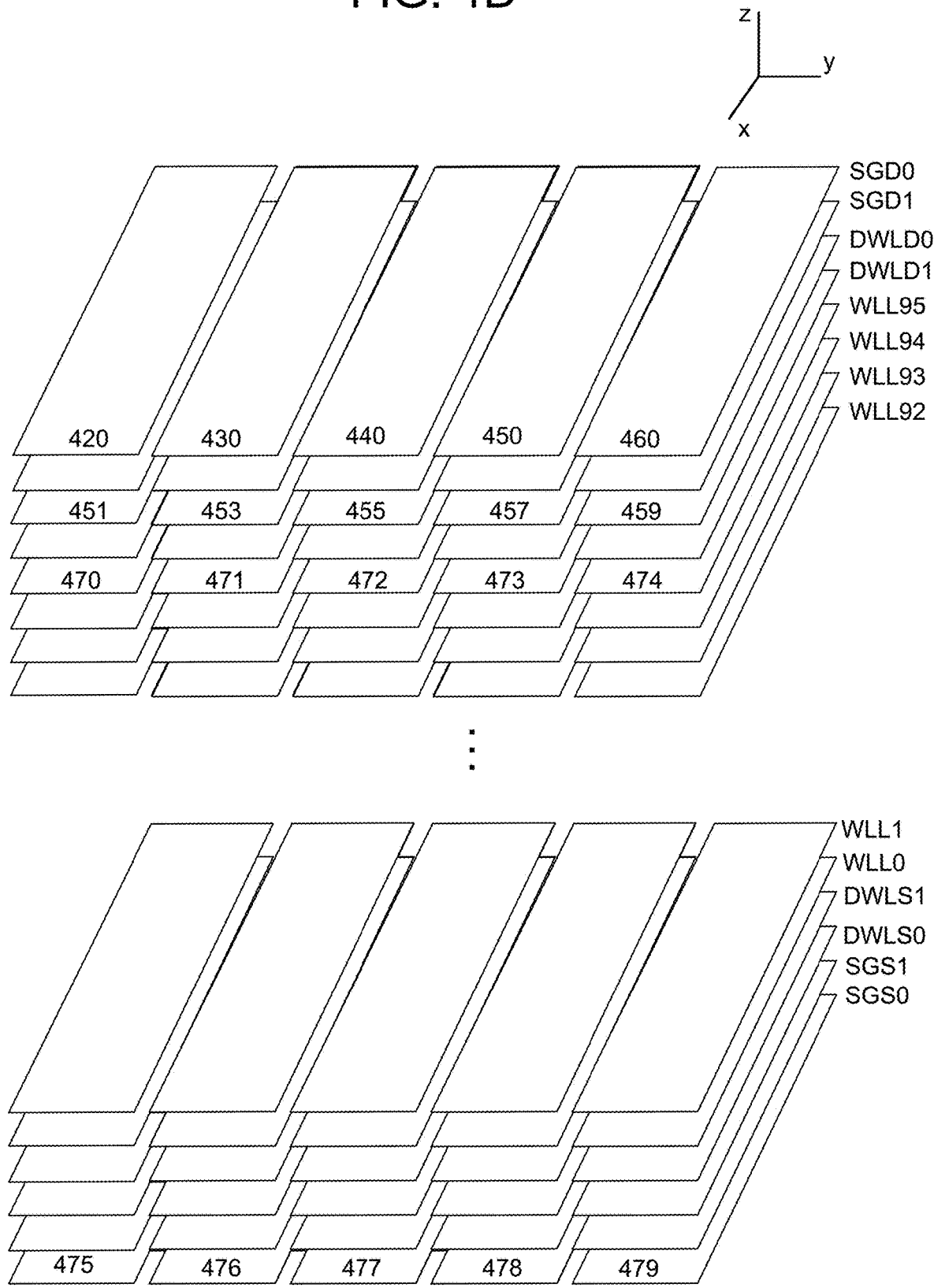
FIG. 4D depicts an alternative view of the select gate layers and word line layers of the stack 435 of FIG. 4C.

FIGS. 4B-4D depict an example three dimensional ("3D") NAND structure that corresponds to the structure of FIG. 3 and can be used to implement memory structure 126 of FIG. 2A or 326 of FIG. 2B. FIG. 4B is a block diagram depicting a top view of a portion of one block from memory structure 126 or 326. The portion of the block depicted in FIG. 4B corresponds to block portion 306 in block 2 of FIG. 4A. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 462. Vertical column 422 implements NAND string 482. Vertical column 432 implements NAND string 484. Vertical column 442 implements NAND string 486. Vertical column 452 implements NAND string 488. Vertical column 462 implements NAND string 489. More details of the vertical columns are provided below. The block depicted in FIG. 4B extends to include more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452 and 462 (one column, or NAND string, in each region).

The block depicted in FIG. 4B includes a set of local interconnects 402, 404, 406, 408, 409 and 410 that connect to a source line below the vertical columns. Local interconnects 402, 404, 406, 408, 409 and 410 also serve to divide each layer of the block into five regions; for example, the block depicted in FIG. 4B is divided into regions 420, 430, 440, 450 and 460, which are separated by local interconnects 402, 404, 406, 409 and 410, so that each layer is divided into portions which may be referred to as fingers. In the layers of the block that implement memory cells, the five portions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column, or NAND string, in each of regions 420, 430, 440, 450 and 460. In one embodiment, NAND strings of different regions that are connected to a common bit line may be connected to the same word line (via different word line fingers on the same level that are connected together); therefore, the system uses the source side selection lines and the drain side selection lines to choose one (or another subset) to be subjected to a memory operation (program, verify, read, and/or erase). A given bit line may connect to a fixed number of NAND strings in each block. For example, bit lines 415 each connect to five NAND strings in block portion 306 (e.g., bit line 414 connects to NAND strings 482, 484, 486, 488 and 489). When performing memory access operations (e.g., programming and reading), such strings may be accessed at different times. For example, when programming or reading memory cells in a given level of a block, programming may proceed sequentially from region to region (string to string). Thus, memory access operations may access some or all NAND strings in region 420 of the block at a first time, access some or all NAND strings in region 430 at a second time, access some or all NAND strings in region 440 at a third time, access some or all NAND strings in region 450 at a fourth time and access some or all NAND strings in region 460 at a fifth time. In other examples, fewer or more than five such regions may be provided in a block. The NAND strings in a region of a block may be referred to collectively for convenience when referring to access operations directed to parallel access to such NAND strings. For example, accessing NAND strings of region 420 may be referred to as accessing "String 1," accessing NAND strings of region 430 may be referred to as accessing "String 2," accessing NAND strings of region 440 may be referred to as accessing "String 3," accessing NAND strings of region 450 may be referred to as accessing "String 4" and accessing NAND strings of region 460 may be referred to as accessing "String 5."

FIG. 4B also shows the vertical columns being staggered. In other embodiments, different patterns of staggering can be used. In some embodiments, the vertical columns are not staggered.

FIG. 4C depicts an embodiment of a stack 435 showing a cross-sectional view along line AA of FIG. 4B. Two SGD layers (SGD0, SDG1), two SGS layers (SGS0, SGS1) and six dummy word line layers DWLD0, DWLD1, DWLM1, DWLM0, DWLS0 and DWLS1 are provided, in addition to the data word line layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 303, an insulating film 250 on the substrate, and a portion of a source line SL. A portion of the bit line 414 is also depicted. Note that NAND string 484 is connected to the bit line 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bit line 414. The local interconnects 404 and 406 from FIG. 4B are also depicted.

FIG. 4D depicts an alternative view of the SG layers and word line layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG portions in regions 420, 430, 440, 450 and 460 consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer portions 451, 453, 455, 457 and 459. A dummy memory cell, also referred to as a non-data memory cell, does not store data and is ineligible to store data, while a data memory cell is eligible to store data.

Below the dummy word line layers are the data word line layers. For example, WLL95 comprises word line layer regions 470, 471, 472, 473 and 474.

Below the data word line layers are the source-side dummy word line layers DWLS0 and DWLS1. Each source-side dummy word line can be independently controlled, in one approach (e.g., different voltages may be applied to DWLS0 and DWLS1). Alternatively, the source-side dummy word lines may be connected and commonly controlled (e.g., same voltage may be applied to DWLS0 and DWLS1)

Below the source-side dummy word line layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477, 478 and 479 as shown in FIG. 4D. Each SG line can be independently controlled, in one approach. Or the SG lines can be connected and commonly controlled.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Although the example memory system of FIGS. 3-4D is a three dimensional memory structure that includes vertical NAND strings with charge-trapping material, other (2D and 3D) memory structures can also be used with the technology described herein (e.g., other memory structures with NAND strings including a plurality of data memory cells coupled to a plurality of data word lines in series with a plurality of dummy memory cells connected to a plurality of dummy word lines). Different operations for accessing data in non-volatile memory cells (e.g., read, program, and program verify) that are described below may be applied to one or more of the example memory systems described above with respect to FIGS. 1-4D.

Typically, the program voltage applied to the control gates (via a selected word line) during a program operation is applied as a series of program pulses. Between programming pulses of program steps are a set of verify pulses to perform verification in verify steps (e.g., alternating program steps and verify steps in a program operation). In many implementations, the magnitude of the program pulses is increased with each successive pulse by a predetermined step size.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with an erased state so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming.

Figure 5A:
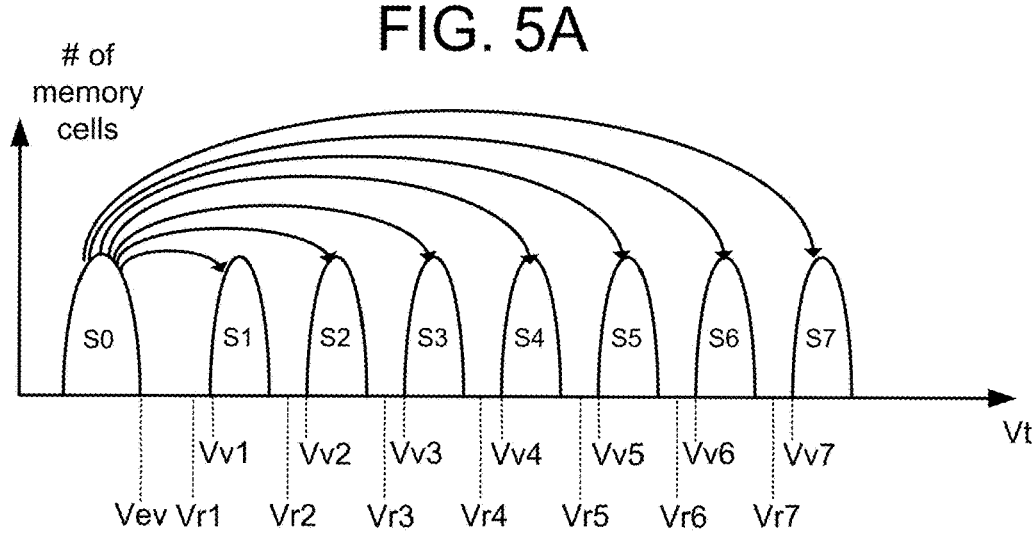
FIGS. 5A-C illustrate examples of program, erase and sanitization operations.

FIG. 5A shows threshold voltage distributions for eight data states, S0 to S7, corresponding to three bits of data per cell (Three Level Cell, or TLC). Also shown are seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read voltages, the system can determine what data state (i.e., S0, S1, S2, S3, . . . ) a memory cell is in.

FIG. 5A also shows seven verify reference voltages, Vv1, Vv2, Vv3, Vv4, Vv5, Vv6, and Vv7 used in read verify steps during a programming operation. When programming memory cells to data state S 1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In general, during sensing of verify and read operations, the selected word line is connected to a voltage (one example of a reference signal or read voltage), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to sense whether a threshold voltage of the concerned memory cell has reached such level. After applying the read voltage to the word line, the conduction current of the memory cell is measured to determine whether the memory cell turned on (conducted current) in response to the voltage applied to the word line. If the conduction current is measured to be greater than a certain value (e.g., Isense), then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

During a read or verify process, the unselected data memory cells are provided with one or more read pass voltages (also referred to as bypass voltages) at their control gates so that these data memory cells will operate as pass gates (e.g., conducting current regardless of whether they are programmed or erased), select gates of selected NAND strings are provided with sufficient voltage (e.g., select voltages via select lines) to make corresponding select transistors conductive ("turn on") and dummy memory cells of selected NAND strings are provided with sufficient voltage (e.g., dummy word line voltage via dummy word lines) to make corresponding dummy memory cells conductive.

There are many ways to measure the conduction current of a memory cell during sensing in a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for sensing during verify or read operations. Other read and verify techniques known in the art can also be used.

Figure 5B:
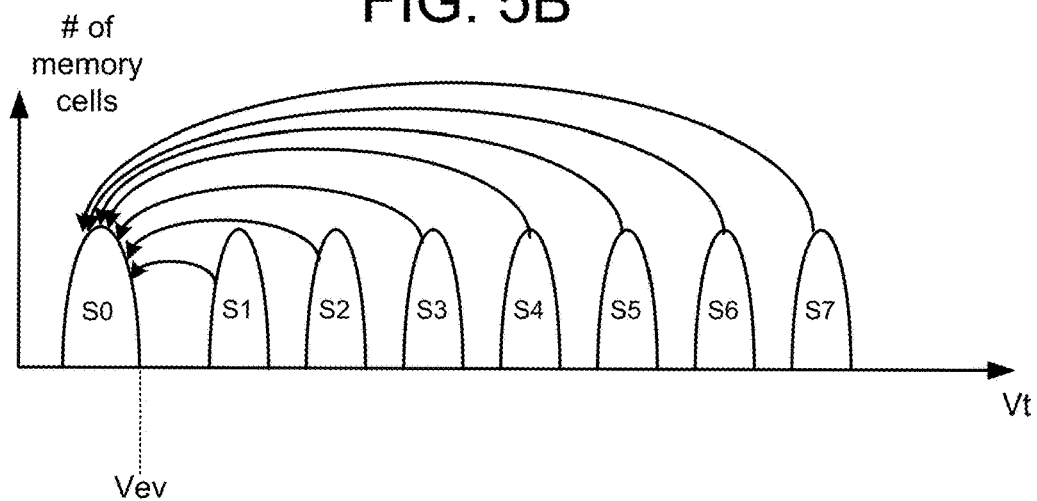

FIG. 5B illustrates an example of an erase operation performed on previously programmed memory cells (e.g., memory cells programmed to distributions S1 to S7 as illustrated in FIG. 5A). When a block is erased, memory cells of the block have their threshold voltages reduced from their programmed data states (e.g., from data states 51 to S7) to the erased state (S0). FIG. 5B shows Vev, which is a voltage level to test whether a memory cell has been properly erased (e.g., whether a memory cell is in the S0 data state). An erase operation may continue until all (or substantially all) memory cells in a block have a threshold voltage less than Vev.

In some cases, it may be desirable to destroy data that is stored in non-volatile memory cells (e.g., for security reasons). While an erase operation may be used to erase an entire block (e.g., setting threshold voltages of all memory cells to S0 data state) to thereby destroy all data stored in the block, in some cases it may be undesirable to immediately erase an entire block which contains data to be destroyed. For example, erasing a block may require significant time and/or resources. If valid data is stored in the block then copying such valid data prior to erase may further increase time and/or resources needed. And erasing may increase wear on a block.

Figure 5C:
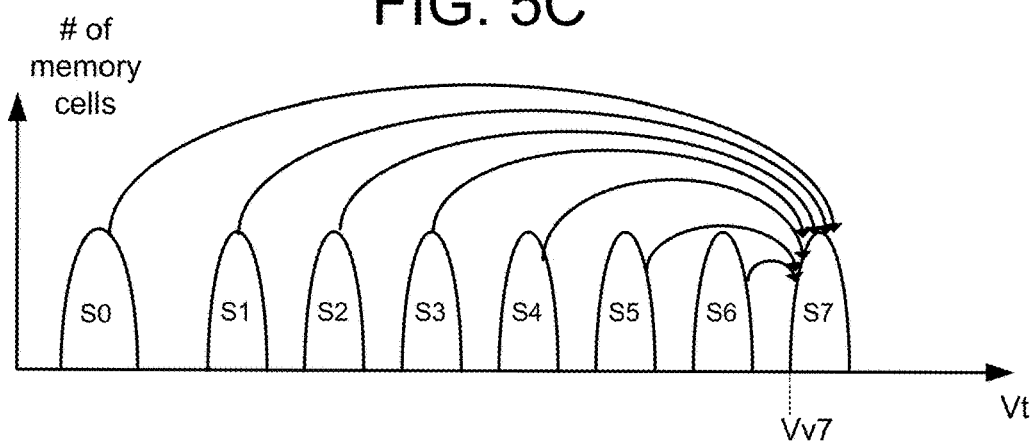

FIG. 5C shows an example of a method of destroying data in a block, or a portion of a block, without erasing the block using an operation referred to as "data sanitization." In a data sanitization operation, threshold voltages of memory cells are increased from their programmed states (e.g., S1-S6) or the erase state (S0) to a higher threshold voltage (e.g., to the S7 data state). Increasing threshold voltage in a sanitization operation may be performed by applying voltage pulses in a manner similar to a program operation. Such an operation may be directed to a portion of a block that is less than the entire block. For example, an individual word line, or portion of a word line may be sanitized while other word lines in the block are not sanitized and continue to store data. Thus, a subset of data in a block (some or all data of one or more word lines) may be sanitized without performing an erase operation and without moving any data from the block.

FIG. 5C shows a data sanitization operation performed on previously programmed memory cells (e.g., memory cells programmed to distributions 51 to S7 as illustrated in FIG. 5A). A data sanitization operation may be performed in response to a command from a user that identifies specific data to sanitize. When data sanitization is applied to memory cells, the threshold voltages of the memory cells are increased from data states corresponding to user data to a threshold voltage range that does not correspond to the user data so that the user data cannot be obtained from threshold voltages of the memory cells. The verify voltage Vv7 is a used to test whether memory cells have been properly sanitized. A sanitization operation may continue until all (or substantially all) memory cells to be sanitized have a threshold voltage greater than a predetermined target threshold voltage (e.g., Vv7).

While the example of FIG. 5C shows all memory cells in data states S0-S6 having their threshold voltages increased, in some cases only a subset of memory cells may have their threshold voltages increased (e.g., only memory cells in certain data states such as only S3-S6). While the example of FIG. 5C shows all memory cells in data states S0-S6 having their threshold voltages increased to a single threshold voltage range corresponding to data state S7, a different threshold voltage range, or ranges, may be chosen. For example, a threshold voltage range that is less or greater than that of data S7 may be used. In an example, two or more threshold voltage ranges may be used for two or more groups of data states (e.g., memory cells in data states S0 to S2 may be sanitized by increasing their threshold voltages to a first range corresponding to data state S3 and memory cells in data states S4 to S6 may be sanitized by increasing their threshold voltages to a second range corresponding to data state S7). In some cases, memory cells may be sanitized by increasing their threshold voltages to threshold voltage ranges that are randomized (e.g., threshold voltages of some memory cells in data state 51 are increased to data state S7 as shown while others are increased to another threshold voltage range such as S2 to S6). In the example of FIG. 5C, only memory cells that are programmed to data state S7 are unaffected by a sanitization operation while in other examples additional memory cells may be unaffected as long as a sufficient number of memory cells are changed to ensure that the stored data cannot be recovered. In examples of sanitization operations, at least some non-volatile memory cells in a group of non-volatile memory cells to be sanitized have their threshold voltages increased to one or more threshold voltage ranges outside their programmed threshold voltage ranges.

Figure 6:
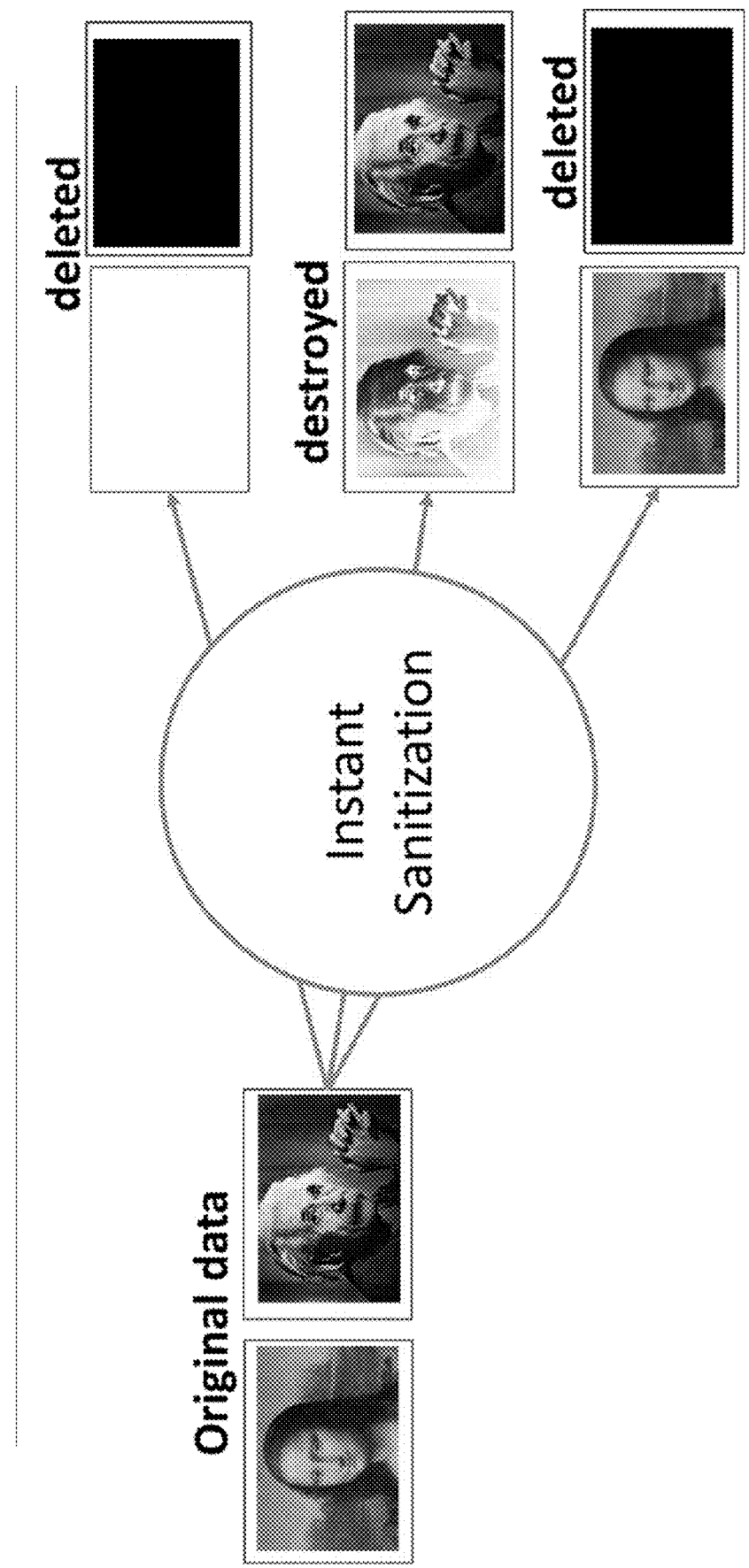
FIG. 6 illustrates an example of instant sanitization of data.

FIG. 6 illustrates the effects of sanitization on data stored in non-volatile memory cells. The data in FIG. 6 includes two images, photographs of the mona Lisa and Albert Einstein, that are stored together in non-volatile memory cells (e.g., in a 3D NAND structure such as memory structure 126. In the top example, both photographs are deleted so that attempting to read the data results in a blank image (either all white or all black in the example shown). In the middle example, the mona Lisa is destroyed and attempting to read the data results in a negative of Albert Einstein (e.g., because of coupling effects). The photograph of Albert Einstein remains unaffected in this operation. In the bottom example, the photograph of Albert Einstein is deleted and the mona Lisa is unaffected by the operation.

FIG. 7 shows an example of a sanitization operation applied to non-volatile memory cells in a Quad Level Cell (QLC) configuration in which an individual memory cell stores four bits of data using sixteen data states (States S0 to S15). Four logical pages of data may be stored together in such QLC memory. The leftmost column of FIG. 7 indicates the four logical pages stored including Top ("T"), Upper ("U"), Middle ("M") and Lower ("L"). The second column from the left indicates which read levels are used for each logical page. For example, the lower logical page, L, may be obtained using read levels Vv5 "5" (between S4 and S5), Vv11 "11" (between S10 and S11) and Vv14 "14" (between S13 and S14). Shading along the row corresponding to the lower logical page, L, shows how reading at these three levels may determine whether a cell stores a logical 0 or 1 for the lower logical page (e.g., if reading at Vv5 and Vv11 shows that the threshold voltage is between these voltages then the memory cell is in one of data states S5 to S10 and the lower logical page bit is a logical 0). When a sanitization operation is performed as illustrated, all memory cells in data states S0 to S14 have their threshold voltages increased so that they are above Vv15 (e.g., in a threshold voltage range corresponding to S15). The bottom two rows of FIG. 7 illustrate the distribution of memory cells in different data states before and after a sanitization operation. Before sanitization ("Cell % Before"), memory cells are evenly distributed between data states with 6.25% of memory cells being in each data state. After sanitization ("Cell % after"), all memory cells (100%) are in data state S15 and no memory cells (0%) are in any of data states S0 to S14. Charge may be added to memory cells during a sanitization operation in a manner that is similar to a program operation. In some cases, such added charge may have some effects on nearby memory cells (e.g., memory cells of other word lines).

Figure 8A:
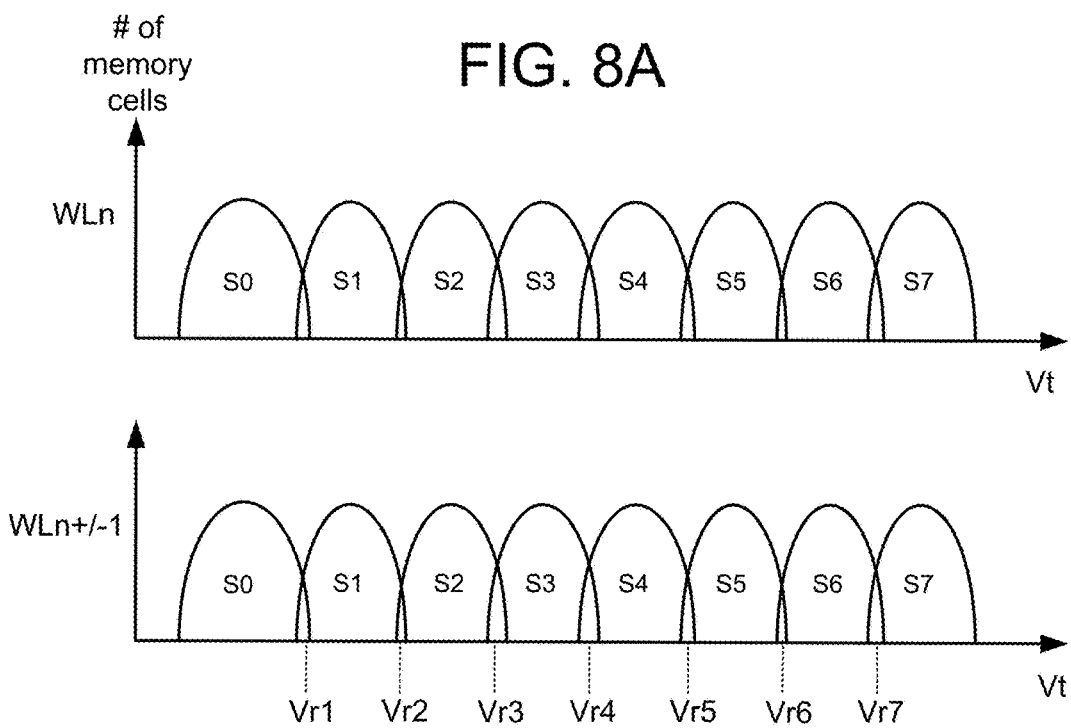
FIGS. 8A-C illustrate examples of a sanitization operation including effects on non-volatile memory cells of adjacent word lines.
Figure 8B:
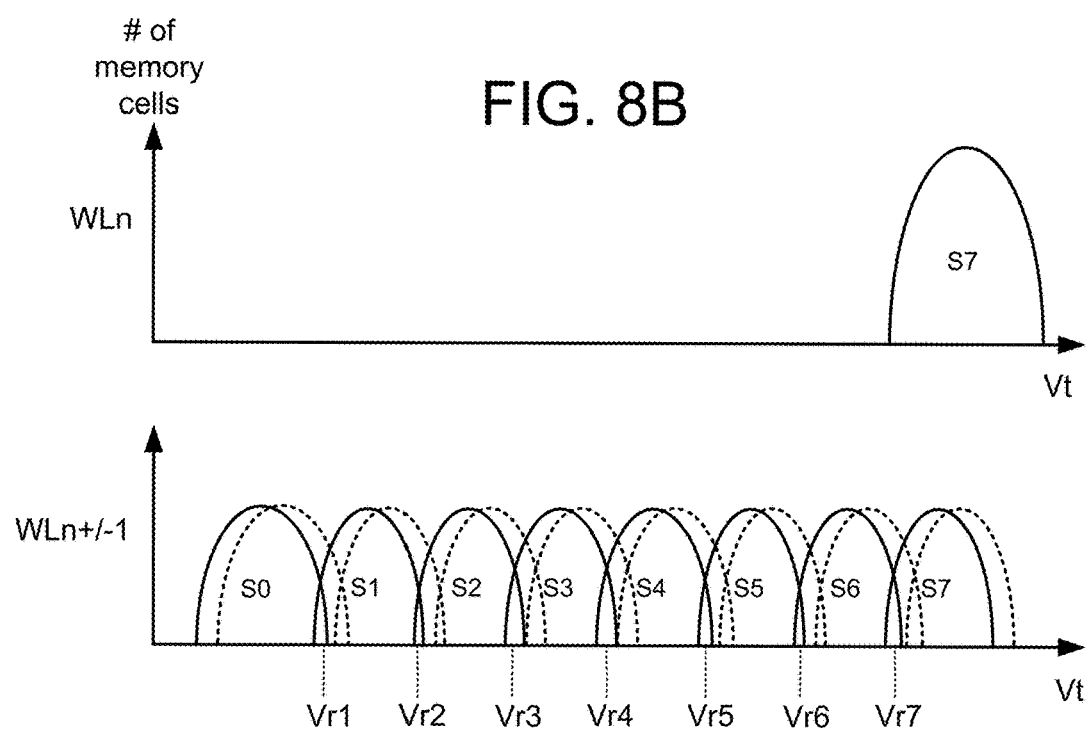

FIGS. 8A-B illustrate an example of sanitization of a target word line, WLn, and one or more adjacent word line (e.g., WLn+1 and WLn−1, written as "WLn+/−1"). While the effects are illustrated as being the same for both adjacent word lines WLn+1 and WLn−1 (e.g., word lines above and below the target word line in a 3D NAND structure as illustrated in FIG. 4C), in other examples, different word lines may be affected differently (e.g., WLn+1 and WLn−1 may be affected differently). FIGS. 8A-B illustrate an example of sanitization in a Three Level Cell (TLC) memory that stores three bits of data using eight data states. Other memories, including QLC and SLC memories, may be similarly affected, and the present technology is not limited to any particular memory configuration.

FIG. 8A shows word lines WLn and WLn+/−1 prior to a sanitization operation. Data is randomized in this example so that there are roughly equal numbers in each data state S0 to S7 along WLn and along adjacent word lines WLn+1 and WLn−1. Read voltages Vr1 to Vr7 are shown located where threshold voltage distributions of data states meet. Such read voltages allow accurate reading of data (e.g., few errors, which may be corrected by ECC).

FIG. 8B shows word lines WLn and WLn+/−1 after a sanitization operation is performed on WLn (WLn is the target word line for the sanitization operation). The sanitization operation of this example increases threshold voltages of all memory cells in data states S0 to S6 have threshold voltages corresponding to data state S7 (e.g., threshold voltage above a predetermined threshold voltage such as Vv7). The increase in threshold voltages may be implemented by a series of pulses that add charge stored in memory cells. The added charge may affect nearby memory cells, including memory cells along adjacent word lines WLn+/−1. Threshold voltage distributions associated with data states S0 to S7 are shifted upwards for memory cells along WLn+/−1 as shown by dotted lines. As a result of this shift in threshold voltages, a read operation using Vr1 to Vr7 that is directed to memory cells along WLn+1 or WLn−1 may have a significant number of errors (e.g., more errors than the example of FIG. 8A).

Figure 8C:
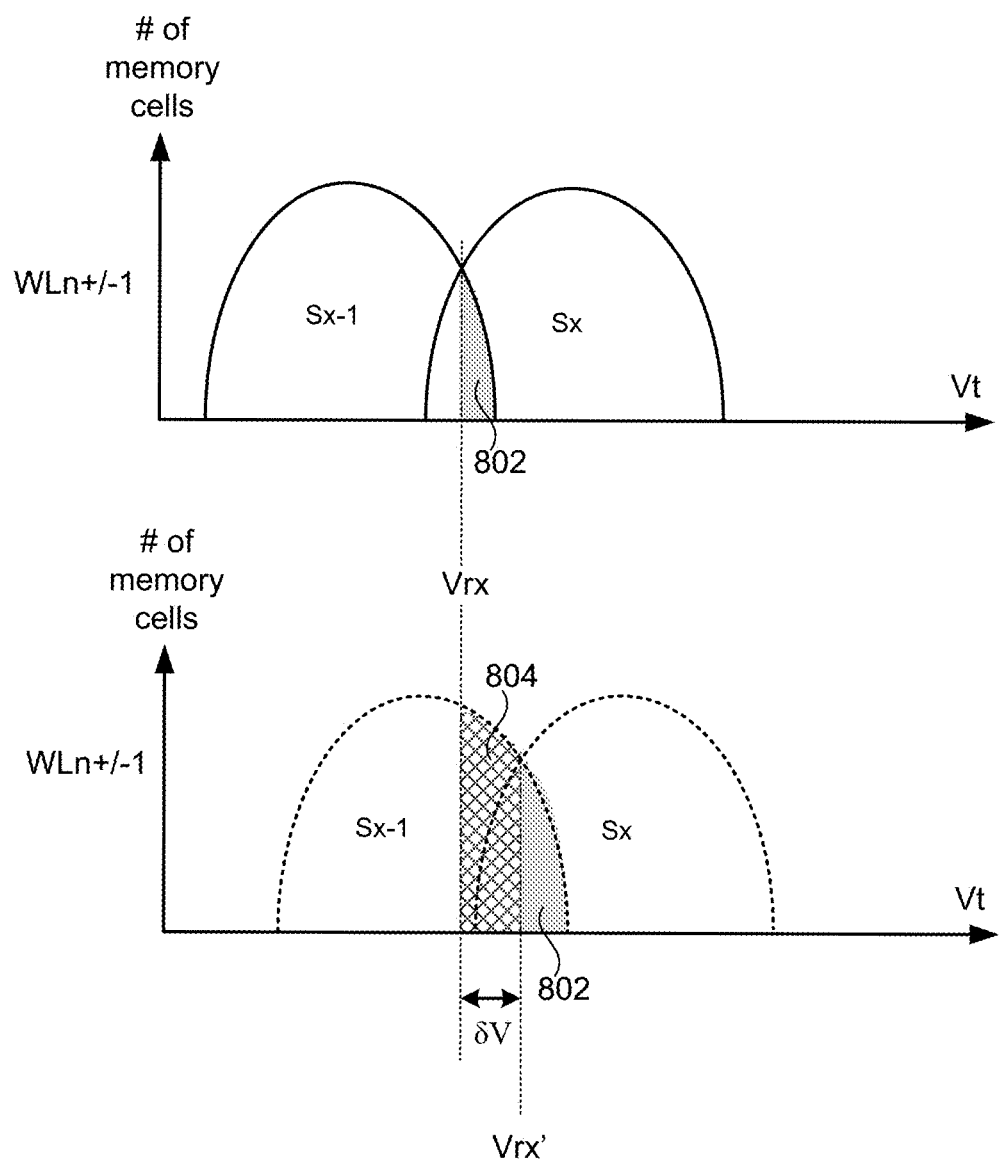

FIG. 8C further illustrates the shifting of threshold voltage distributions along WLn+/−1 that may occur as a result of a sanitization operation directed to WLn. FIG. 8C illustrates two adjacent data states Sx-1 and Sx (e.g., any two adjacent data states of S0 to S7 of FIGS. 8A-B) before (top) and after (bottom) a sanitization operation is performed on WLn. A read voltage Vrx may be used to accurately discriminate between memory cells in Sx-1 and Sx prior to sanitization as illustrated in the upper plot. A relatively small number of memory cells that were programmed to data state Sx-1 may be read as being in data state Sx as illustrated by shaded area 802. The bad bits caused by such misreading may be corrected by ECC.

After sanitization of WLn, threshold voltage distributions are shifted towards higher voltage as illustrated by shifted distributions in the lower plot. As a result, reading such memory cells using read voltage Vrx may result in a significant number of errors (significantly increased compared with the upper plot). The number of memory cells that were programmed to data state Sx-1 and are read as being in data Sx is increased as shown by hashed area 804. The bad bits caused by such misreading may be uncorrectable by ECC (UECC), may take significant ECC resources to correct, or may otherwise be undesirable.

According to examples of the present technology, one or more adjusted read voltage may be used to read data along a word line that is adjacent to a sanitized word line. FIG. 8C shows adjusted read voltage Vrx', which is increased with respect to Vrx by a voltage offset 6V. Because read voltage Vrx' is adjusted for the shifted threshold voltage distributions, results of read operations performed using read voltage Vrx' may be more accurate than read operations performed using read voltage Vrx (e.g., the number of bad bits may be reduced significantly as illustrated by area 804) so that any errors may be more easily correctable by ECC. While FIG. 8C shows a single read voltage, more than one read voltage may be adjusted in this way (e.g., some or all of read voltages Vr1 to Vr7 of FIG. 8B may be adjusted to more accurately read data states S0 to S7). In an example, unadjusted read voltages (a first set of read voltages such as Vr1 to Vr7) are used to read word lines that are not adjacent to a sanitized word line and adjusted read voltages (a second set of read voltages such as Vr1' to Vr7') are used to read word lines that are adjacent to a sanitized word line. In some cases, all read voltages are uniformly adjusted (e.g., increased by the same voltage offset 6V) while in other cases, different read voltages may be adjusted by different offsets. In some cases, only a subset of read voltages are adjusted (e.g., Vr5 to Vr7 may be adjusted and Vr1 to Vr4 may remain unchanged). Appropriate adjusted read voltages may be found by testing. For example, a population of memory systems storing test data may have certain word lines sanitized. Then, the target data of word lines adjacent to the sanitized word lines may be read using different read schemes (e.g., different voltage offsets) to find an appropriate read voltage scheme.

In order to apply the desired set of read voltages to a given word line, an appropriate scheme may be used to track which word lines are adjacent to sanitized word lines. Some record may be kept to indicate which word lines are sanitized and/or which word lines are adjacent to word lines that are sanitized. A list, table, flags, or other record may be maintained in a suitable location on a memory die or elsewhere (e.g., in a control die).

Figure 9:
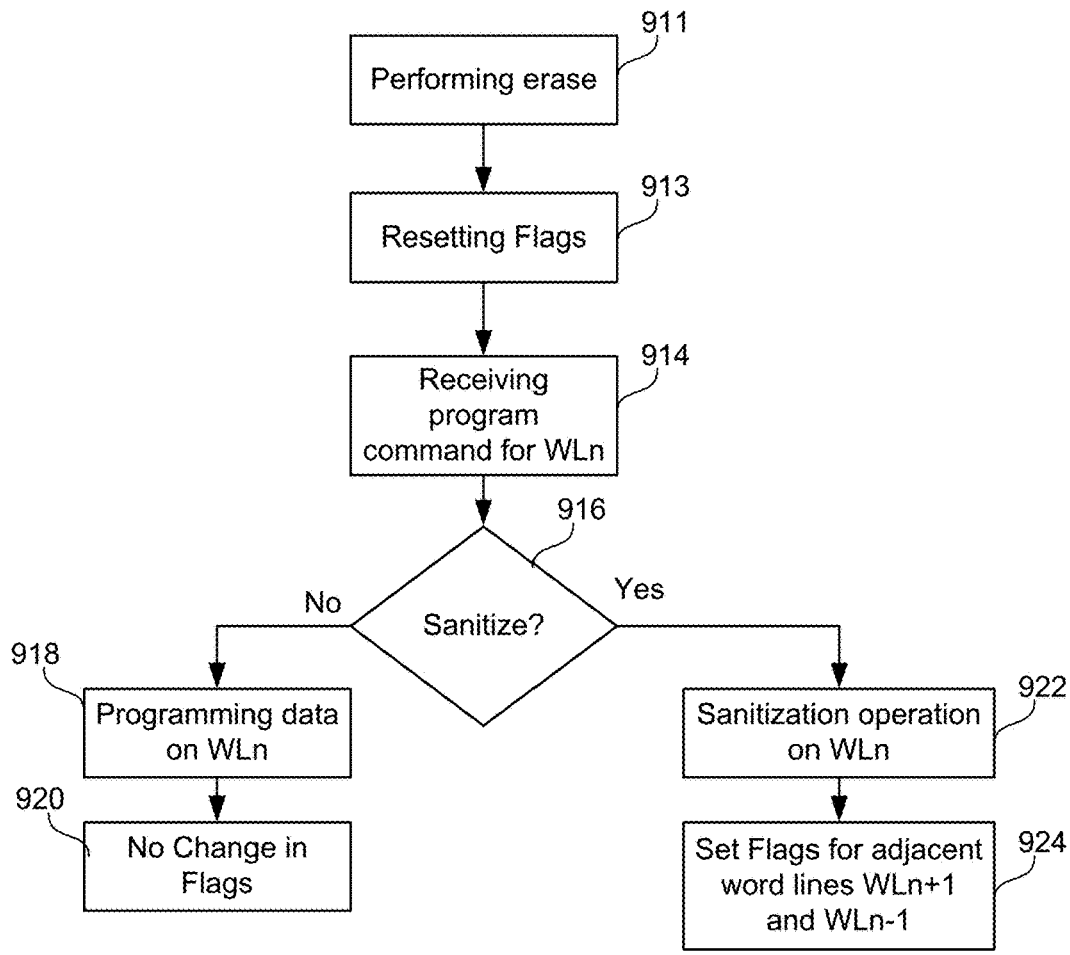
FIG. 9 illustrates an example sanitization operation include setting flags.

FIG. 9 shows an example of a method that records the status of a word line as either adjacent to a sanitized word line or not adjacent to a sanitized word line, with the status of each word line indicated by a flag that is recorded on the word line (e.g., using one or more memory cells coupled to the word line). The method includes performing an erase operation 911 and resetting flags 913. For example, when an erase operation is performed to erase all data in a block (e.g., as illustrated in FIG. 5B) flags associated with each word line in the block may be reset as part of the erase operation. In some examples, flags are maintained in memory cells and the erased data state may correspond to a flag being "not set" so that erasing all memory cells causes flags to be reset to the "not set" condition. The method further includes subsequently receiving a program command for a target word line, WLn, 914. In this example, a command to perform a sanitize operation is a type of program command that overwrites previously programmed data. A determination is made 916 as to whether the command is a sanitize command. If it is determined that the received command is not a sanitize command (e.g., command is a program command to program user data) then programming of data on WLn is performed 918 and there is no change in the flags 920 (flags may remain in the "not set" or "0" state). If it is determined that the received command is a sanitize command then a sanitization operation is performed on target word line WLn 922 and flags are set for adjacent word lines WLn+1 and WLn−1 924.

Figure 10A:
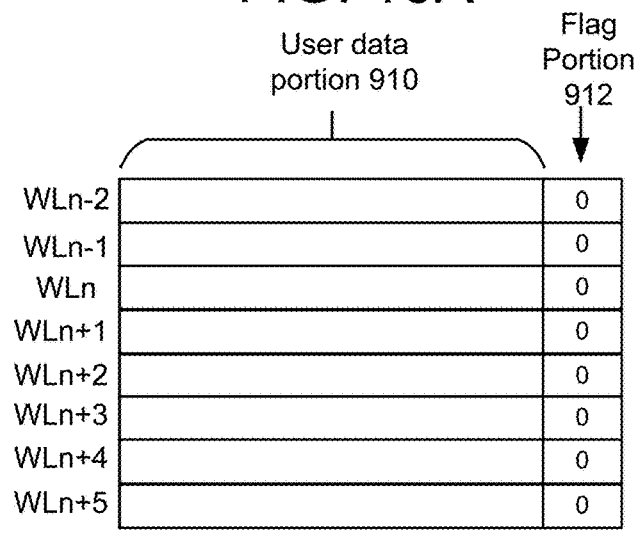
FIGS. 10A-C illustrate an example of sanitization of a target word line and setting flags on adjacent word lines.
Figure 10B:
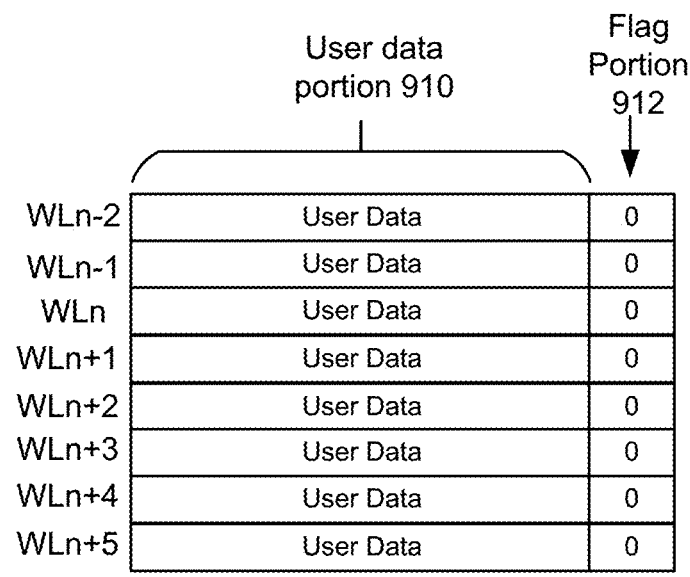
Figure 10C:
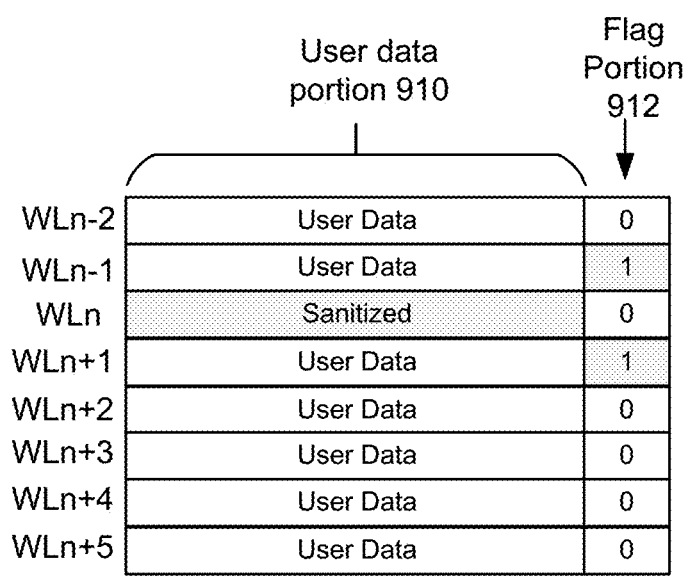

FIGS. 10A-C illustrate how flags may be recorded in a block, with flags stored on respective word lines (e.g., flag for WLn stored on WLn, flag for WLn+1 stored on WLn+1 and so on). FIG. 10A shows a portion of a block including word lines WLn−2 to WLn+5, where n may be any number. FIG. 10 shows each word line having a user data portion 910 and a flag portion 912. The user data portion 910 is empty at this point and all flags show a "0" or "not set" value (e.g., after an erase operation such as erase operation 911).

FIG. 10B shows word lines WLn−2 to WLn+5 of FIG. 10A at a subsequent time, after user data is written in user data portion 910 of each word line. When data is programmed, flags are not changed so that all flags continue to show a "0" or "not set" status (e.g., as in steps 918, 920).

FIG. 10C shows word lines WLn−2 to WLn+5 at a subsequent time, after WLn is sanitized. For example, a command may be received that identifies WLn as a target word line and a determination may be made that the command is a sanitize command resulting in a sanitize operation (e.g., as in steps 914, 916, 922). Because WLn is sanitized, flags for adjacent word lines WLn+1 and WLn−1 (word lines immediately below and immediately above WLn respectively) in flag portion 912 are set to a "1" value to indicate that word lines WLn+1 and WLn−1 are adjacent to a sanitized word line. Flag portion 912 may be considered an example of means for recording status of individual word lines of an array of non-volatile memory cells as either adjacent to a sanitized word line or not adjacent to a sanitized word line.

Subsequent to setting the flags illustrated in FIG. 10C, read commands may be received that are directed one or more of the word lines shown. The flags may be used to determine an appropriate read scheme for reading different word lines (e.g., different read schemes for word lines adjacent to sanitized word lines and for word lines not adjacent to sanitized word lines).

Figure 11:
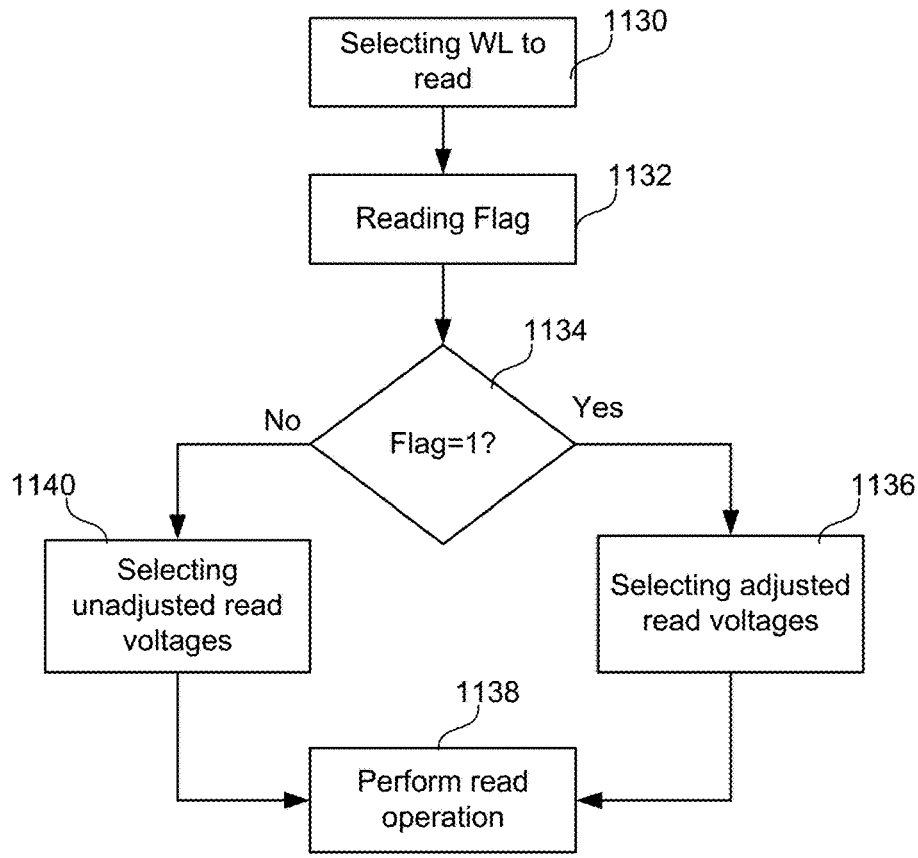
FIG. 11 illustrates an example of reading word lines using read voltages that are selected according to a flag that indicates if an adjacent word line is sanitized.

FIG. 11 shows an example of a method of reading data from word lines such as word lines WLn−2 to WLn+5. The method includes selecting a first line to read 1130 (e.g., in response to a read command directed to data stored in non-volatile memory cells of the first word line) and reading the flag associated with the first word line 1132 (selected word line for read operation). The flag may be stored in one or more memory cell of the first word line or elsewhere. A determination is made 1134 as to whether the flag associated with the first word line is set (has a value "1" in this example) and thus whether a second word line adjacent to the first word line is sanitized. If the flag is set (Flag=1: Yes), then the method includes selecting adjusted read voltages 1136. For example, if the first word line that is selected for the read operation is WLn−1 of FIG. 10C, then Flag=1 because a second word line (WLn) adjacent to the first word line is sanitized (the flag is also set for third word line WLn+1 because it is also adjacent to second word line WLn). Adjusted read voltages may be offset with respect to unadjusted voltages as illustrated in FIG. 8C (e.g., increased by an offset voltage). If the flag is not set at step 1134 (Flag=1: No), then the method further includes selecting unadjusted read voltages 1140. For example, when another command is received that is directed to a fourth word line (e.g., WLn+4) for which the corresponding flag has not been set, the unset flag (value "0") indicates that no word line adjacent to the fourth word line (WLn+4) is sanitized so that unadjusted read voltages may be used for a read operation directed to the non-volatile memory cells of the fourth word line.

Figure 12:
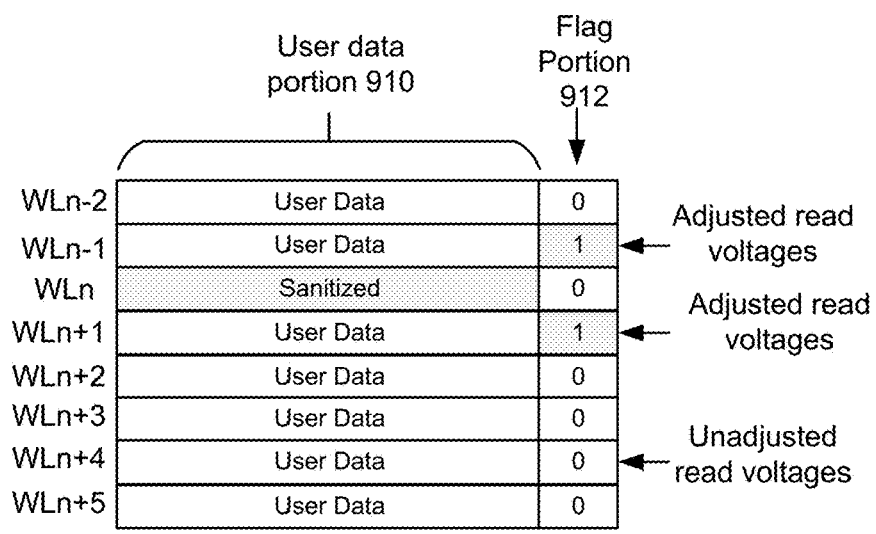
FIG. 12 illustrates an example of reading word lines using different read voltages.

FIG. 12 illustrates different read operations in the example where a first word line, WLn, is sanitized. As a result, respective flags are set for second and third word lines on either side of WLn, WLn+1 and WLn−1 (as described with respect to FIG. 10C). When read commands are received that are directed to data stored in memory cells of adjacent word lines WLn+1 or WLn−1, adjusted read voltages are used in response to determining that respective flags are set. When read commands are received that are directed to data stored in memory cells of word lines that are not adjacent to a sanitized word line (e.g., any WL other than WLn−1 or WLn+1 of FIG. 12), then unadjusted read voltages may be used. For example, a read command directed to data stored in memory cells of a fourth word line WLn+4 may result in a read operation that is performed using unadjusted read voltages.

Figures 13, 14:
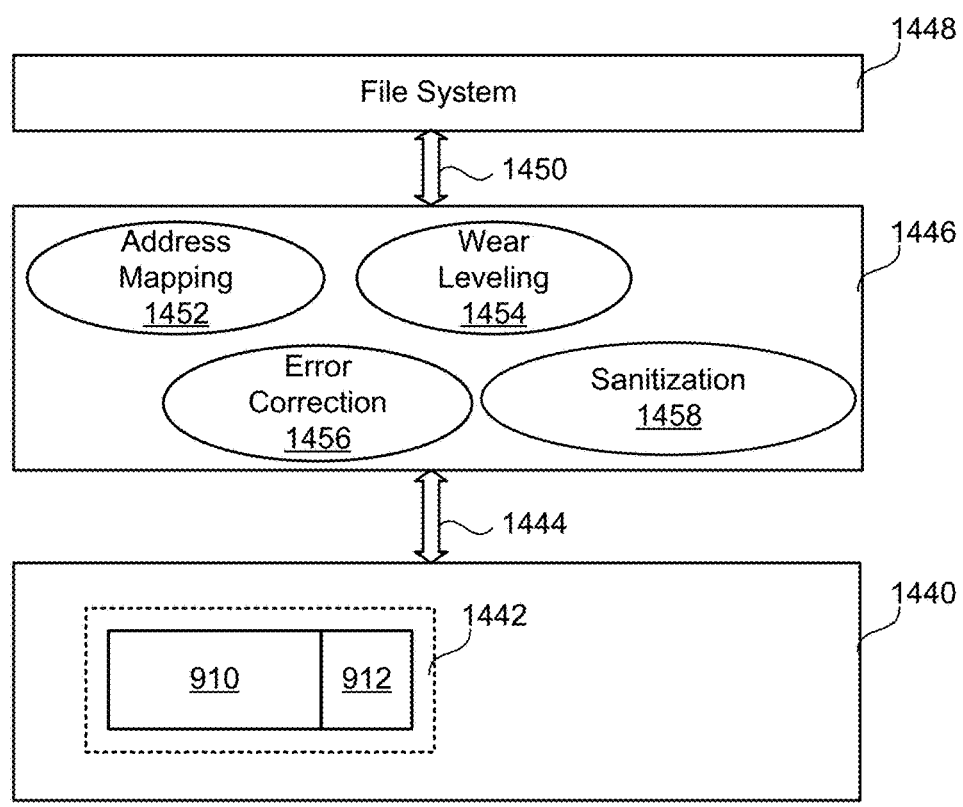
FIG. 13 illustrates an example of voltage offsets that may be used to generate adjusted read voltages.
FIG. 14 illustrates an example that includes structures for sanitization and adjusted read voltages.

FIG. 13 shows an example of a scheme that records an offset voltage (e.g., 6V of FIG. 8C) to be used in reading word lines that are determined to be adjacent to a sanitized word line (e.g., WLn+1 and WLn−1 of FIG. 12). Three bits ("Stored bits") are used in this example to store one of eight implementations according to the present scheme including no offset (e.g., unadjusted read voltage is used for all word lines and no adjusted read voltage is used) and seven possible offsets that provide seven possible read voltage schemes. In other example schemes, different ranges of offset voltages may be used (e.g., greater or less than 0.35 volts) and/or different numbers of possible offset voltages may be available (e.g., four offset voltages represented by two bits or sixteen offset voltages represented by four bits). An offset voltage to be used in a given unit of a memory structure (e.g., a given memory block, plane, die, or other structure) may be indicated by a recorded value, recorded as one or more bits (e.g., as shown in FIG. 13) that are stored in the memory structure or elsewhere. For example, a code (e.g., three-bit code of FIG. 13) may be stored in a Read Only Memory (ROM) such as ROM 122a, ROM 218. An appropriate offset voltage, or offset voltages may be obtained from testing, which may be performed over a population of similar structures and then applied uniformly to such structures (e.g., all blocks of all memory dies of a similar design may use the same voltage offset indicated by the same code). Alternatively, individual dies, planes, blocks, or portions of blocks (e.g., word lines within a block) may use different voltage offsets indicated by different codes. The specific offset, or offsets that are found by testing a sample population may depend on various parameters including the physical structure of the memory array and the programming scheme used. Offset voltages may be fixed throughout the lifetime of a product or may be changed at one or more time (e.g., in response to a high number of errors, a high number of write erase cycles, or other triggering event).

Aspects of the present technology may be implemented in a memory system in a variety of ways using a variety of different physical structures for implementation. FIG. 14 shows a structure that includes a NAND flash memory structure 1440 (e.g., memory structure 126) including an example block 1442, which includes a user data portion 910 and a flag portion 912 (e.g., as previously illustrated in FIGS. 10A-C). NAND flash memory structure 1440 is connected to a flash translation layer 1446 (e.g., media management layer 238) through a first bus (e.g., a memory bus that provides physical addresses for accessing physical locations in NAND flash memory structure 1440, including read, write, sanitize and erase operations). Flash translation layer 1446 is connected to file system 1448 through a second bus 1450 (e.g., a bus that provides logical addresses for accessing particular data). Flash translation layer 1446 includes Address Mapping circuit 1452, which may be configured to maintain a logical-to-physical mapping of logical addresses used by file system 1448 to physical addresses in NAND flash memory structure 1440 and perform translation as needed (e.g., to translate a logical address provided in a read, write, or sanitize command to a corresponding physical address). Flash translation layer 1446 includes Wear Leveling circuit 1454, which may be configured to change physical locations of logical data in order to avoid concentrating wear in any specific locations in NAND flash memory structure 1440 (e.g., assigning frequently updated, or "hot" data to different locations to avoid repeated write erase cycles at a single location). Flash translation layer 1446 includes Error Correction circuit 1456 (e.g., ECC engine 224), which may encode data prior to storage in NAND flash memory structure 1440 and decode data when it is read from NAND flash memory structure 1440 to detect and correct errors. Flash translation layer 1446 includes Sanitization circuit 1458, which may determine when a sanitization command is received (e.g., from file system 1448) and may send corresponding instructions to NAND flash memory structure 1440 (e.g., instructions to increase threshold voltages of memory cells along a target word line and to set flags on word lines adjacent to the target word line as illustrated in FIG. 9). Sanitization circuit 1458 may also determine when a read command is received that is directed to a word line that is adjacent to a sanitized word line. For example, when a read command is received and Address Mapping circuit 1452 identifies the physical address to be read, Sanitization circuit 1458 may check corresponding flag(s) to determine if any word line to be read is adjacent to a sanitized word line. If one or more such word line is to be read, Sanitization circuit 1458 may cause adjusted read voltage(s) to be used. Sanitization circuit 1458 may be considered an example of means for receiving a read command directed to data stored in non-volatile memory cells of a first word line of the array of non-volatile memory cells, determining that a second word line adjacent to the first word line is sanitized and selecting an adjusted read voltage for a read operation directed to the non-volatile memory cells of the first word line based on the determination. Address Mapping circuit 1452, Wear Leveling circuit 1454, Error Correction circuit 1456 and Sanitization circuit 1458 may be implemented by dedicated circuits, programmable logic devices (PLDs), one or more processors (e.g., processor 122c) configured by firmware, or some combination of these or other structures. For example, Address Mapping circuit 1452, Wear Leveling circuit 1454, Error Correction circuit 1456 and Sanitization circuit 1458 may be implemented in controller 122 (e.g., as illustrated in FIG. 2A).

Figure 15:
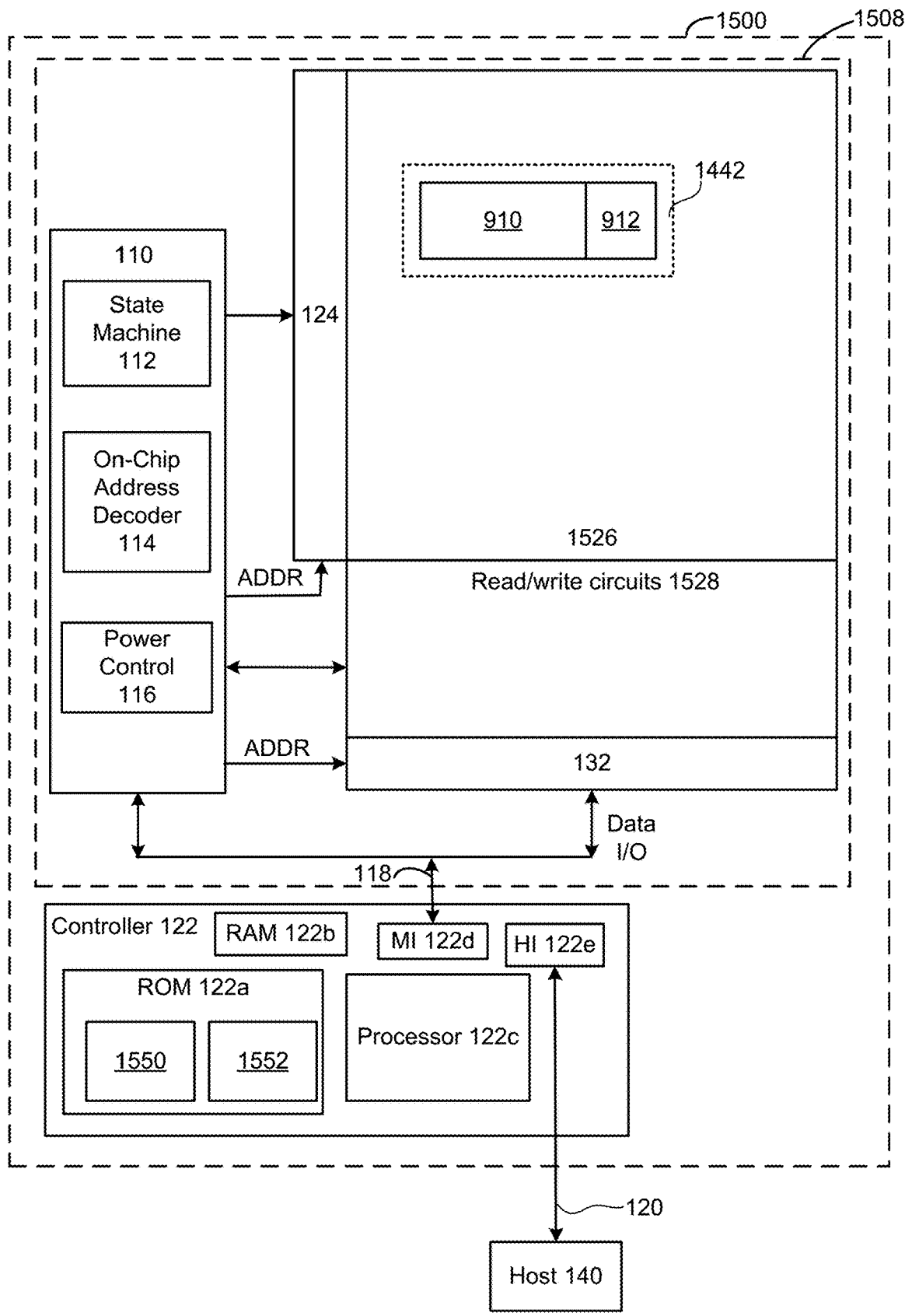
FIG. 15 illustrates an example a memory system configured to implement sanitization and adjusted read voltages.

FIG. 15 shows an example of a storage system 1500, including memory die 1508. Memory structure 1526 of memory die 1508 includes example block 1442 having a user data portion 910 and a flag portion 912, which may be accessed using read/write circuits 1528. (Features of FIG. 15 which were previously described (e.g., with respect to FIG. 1) are similarly numbered and are not further described with respect to FIG. 15.) Read/write circuits 1528 are configured to apply at least two different read schemes including a first read scheme that uses adjusted read voltage(s) and a second read scheme that uses unadjusted read voltage(s). Controller 122 includes ROM 122a, which stores executable code 1550 (e.g., firmware) to configure processor 122c to perform memory controller functions. Executable code 1550 may include code to configure processor 122c to implement one or more of the circuits of flash translation layer 1446 of FIG. 14. ROM 122a also contains configuration data 1552, which may include data indicating an offset voltage to use when reading word lines that are adjacent to a sanitized word line (e.g., one or more of the codes illustrated in FIG. 13). Such code(s) may be stored in an initialization operation and may be based on test data.

Figure 16:
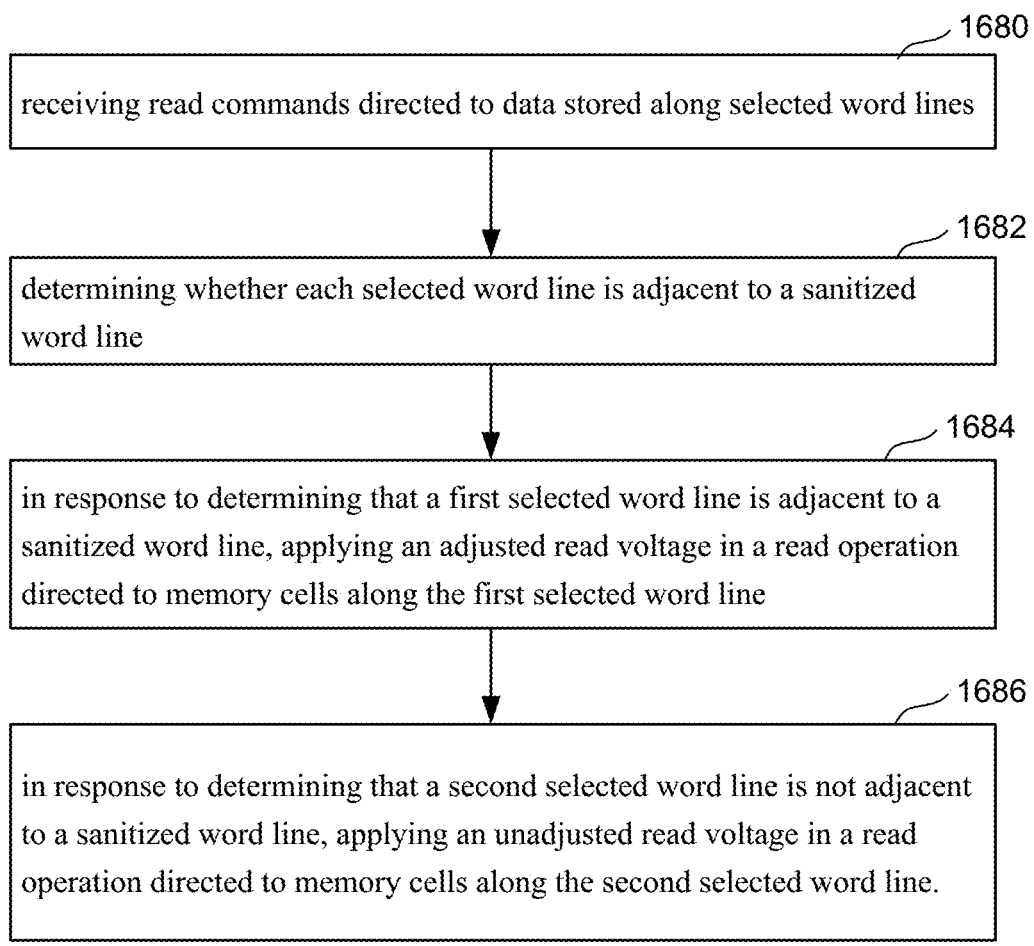
FIG. 16 illustrates an example of a method of operating a non-volatile memory array.

FIG. 16 illustrates a method of operating a non-volatile memory array. The method includes receiving read commands directed to data stored along selected word lines 1680, determining whether each selected word line is adjacent to a sanitized word line 1682 and, in response to determining that a first selected word line is adjacent to a sanitized word line, applying an adjusted read voltage in a read operation directed to memory cells along the first selected word line 1684 (e.g., applying $Vvr'=Vvr+\delta V$ to WLn+/−1 when WLn is sanitized). The method further includes, in response to determining that a second selected word line is not adjacent to a sanitized word line, applying an unadjusted read voltage in a read operation directed to memory cells along the second selected word line 1686 (e.g., applying Vvr when reading WLn+4 of FIG. 12).

In one embodiment an apparatus includes a control circuit configured to connect to non-volatile memory cells. The control circuit is configured to receive a read command directed to data stored in non-volatile memory cells of a first word line and to determine that a second word line adjacent to the first word line is sanitized. The control circuit is further configured to select an adjusted read voltage for a read operation directed to the non-volatile memory cells of the first word line based on the determination.

The control circuit may be further configured to determine that the second word line is sanitized by reading a flag stored along the second word line. The control circuit may be further configured to further configured to set the flag along the second word line in a sanitization operation directed to the first word line. The control circuit may be further configured to set a flag along a third word line in the sanitization operation, the third word line located adjacent to the second word line. The control circuit may be further configured to bring threshold voltages of all non-volatile memory cells of the first word line above a predetermined target threshold voltage in the sanitization operation. The control circuit may be further configured to receive a sanitize command directed to data stored in non-volatile memory cells of the second word line and in response perform a sanitization operation to increase threshold voltages of at least some non-volatile memory cells of the second word line. The control circuit may be further configured to set flags indicating that the first word line and a third word line that is adjacent to the second word line are adjacent to a sanitized word line. The control circuit may be further configured to receive another read command directed to data stored in non-volatile memory cells of a fourth word line, determine that no word line adjacent to the fourth word line is sanitized and select an unadjusted read voltage for a read operation directed to the non-volatile memory cells of the fourth word line. The control circuit may be further configured to store the adjusted read voltage, the adjusted read voltage is obtained from testing.

An example method of operating a non-volatile memory array includes receiving read commands directed to data stored along selected word lines; determining whether each selected word line is adjacent to a sanitized word line; in response to determining that a first selected word line is adjacent to a sanitized word line, applying an adjusted read voltage in a read operation directed to memory cells along the first selected word line; and in response to determining that a second selected word line is not adjacent to a sanitized word line, applying an unadjusted read voltage in a read operation directed to memory cells along the second selected word line.

The adjusted read voltage may be greater than the unadjusted read voltage. Determining whether a selected word line is adjacent to a sanitized word line may include reading a flag stored along the selected word line. The method may further include receiving a sanitize command directed to a target word line; and in response to the sanitize command, increasing threshold voltages of at least some non-volatile memory cells along the target word line in a sanitization operation. The method may further include in response to the sanitize command, increasing threshold voltages of non-volatile memory cells along the target word line such that threshold voltages of all non-volatile memory cells along the target word line exceed a predetermined threshold voltage. The method may further include setting a first flag associated with a first adjacent word line and a second flag associated with a second adjacent word line, the target word line lying between the first adjacent word line and the second adjacent word line. The method may further include obtaining the adjusted read voltage by reading a recorded value obtained from testing. The method may further include in response to each read command received that is directed to a selected word line of the non-volatile memory array, determining whether the selected word line is adjacent to a sanitized word line according to a set of flags stored on respective word lines of the non-volatile memory array.

An example non-volatile storage device includes: an array of non-volatile memory cells; and means for receiving a read command directed to data stored in non-volatile memory cells of a first word line of the array of non-volatile memory cells, determining that a second word line adjacent to the first word line is sanitized and selecting an adjusted read voltage for a read operation directed to the non-volatile memory cells of the first word line based on the determination.

The non-volatile storage device may further include means for recording status of individual word lines of the array of non-volatile memory cells as either adjacent to a sanitized word line or not adjacent to a sanitized word line. The array of non-volatile memory cells may be a 3D array of non-volatile memory cells and the second word line may be a word line immediately above the first word line or immediately below the first word line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
  a control circuit configured to connect to non-volatile memory cells, the control circuit configured to:
    receive a read command directed to data stored in non-volatile memory cells of a first word line, determine that a second word line adjacent to the first word line is sanitized such that non-volatile memory cells of the second word line have threshold voltages increased from programmed threshold voltages corresponding to programmed data to one or more threshold voltage range that does not correspond to the programmed data, select an adjusted read voltage for a read operation directed to the non-volatile memory cells of the first word line based on the determination and perform the read operation using the adjusted read voltage.

2. The apparatus of claim 1, wherein the control circuit is further configured to determine that the second word line is sanitized by reading a flag stored along the second word line.

3. The apparatus of claim 2, wherein the control circuit is further configured to set the flag along the second word line in a sanitization operation directed to the first word line.

4. The apparatus of claim 3, wherein the control circuit is further configured to set a flag along a third word line in the sanitization operation, the third word line located adjacent to the second word line.

5. The apparatus of claim 3, wherein the control circuit is further configured to bring threshold voltages of all non-volatile memory cells of the first word line above a predetermined target threshold voltage in the sanitization operation.

6. The apparatus of claim 1, wherein the control circuit is further configured to receive a sanitize command directed to data stored in non-volatile memory cells of the second word line and in response perform a sanitization operation to increase threshold voltages of at least some non-volatile memory cells of the second word line.

7. The apparatus of claim 6, wherein the control circuit is further configured to set flags indicating that the first word line and a third word line that is adjacent to the second word line are adjacent to a sanitized word line.

8. The apparatus of claim 1, wherein the control circuit is further configured to receive another read command directed to data stored in non-volatile memory cells of a fourth word line, determine that no word line adjacent to the fourth word line is sanitized and select an unadjusted read voltage for a read operation directed to the non-volatile memory cells of the fourth word line.

9. The apparatus of claim 1, wherein the control circuit is further configured to store the adjusted read voltage, the adjusted read voltage is obtained from testing.

10. A method of operating a non-volatile memory array, the method comprising:
  receiving read commands directed to data stored along selected word lines;
  determining whether each selected word line is adjacent to a sanitized word line along which threshold voltages of memory cells were increased from programmed threshold voltage ranges corresponding to programmed data to one or more higher threshold voltage ranges;
  in response to determining that a first selected word line is adjacent to a sanitized word line, applying an adjusted read voltage in a read operation directed to memory cells along the first selected word line; and
  in response to determining that a second selected word line is not adjacent to a sanitized word line, applying an unadjusted read voltage in a read operation directed to memory cells along the second selected word line.

11. The method of claim 10, wherein the adjusted read voltage is greater than the unadjusted read voltage.

12. The method of claim 10, wherein determining whether a selected word line is adjacent to a sanitized word line includes reading a flag stored along the selected word line.

13. The method of claim 10, further comprising:
  receiving a sanitize command directed to a target word line; and
  in response to the sanitize command, increasing threshold voltages of at least some non-volatile memory cells along the target word line in a sanitization operation.

14. The method of claim 13, further comprising:
  in response to the sanitize command, increasing threshold voltages of non-volatile memory cells along the target word line such that threshold voltages of all non-volatile memory cells along the target word line exceed a predetermined threshold voltage.

15. The method of claim 13, further comprising:
setting a first flag associated with a first adjacent word line and a second flag associated with a second adjacent word line, the target word line lying between the first adjacent word line and the second adjacent word line.

16. The method of claim 10, further comprising:
obtaining the adjusted read voltage by reading a recorded value obtained from testing.

17. The method of claim 10, further comprising:
in response to each read command received that is directed to a selected word line of the non-volatile memory array, determining whether the selected word line is adjacent to a sanitized word line according to a set of flags stored on respective word lines of the non-volatile memory array.

18. A non-volatile storage device comprising:
an array of non-volatile memory cells; and
means for receiving a read command directed to data stored in non-volatile memory cells of a first word line of the array of non-volatile memory cells, determining that threshold voltages of non-volatile memory cells of a second word line adjacent to the first word line are sanitized to have threshold voltages in one or more threshold voltage ranges above their programmed threshold voltage ranges, selecting an adjusted read voltage for a read operation directed to the non-volatile memory cells of the first word line based on the determination and performing the read operation using the adjusted read voltage.

19. The non-volatile storage device of claim 18, further comprising means for recording status of individual word lines of the array of non-volatile memory cells as either adjacent to a sanitized word line or not adjacent to a sanitized word line.

20. The non-volatile storage device of claim 19, wherein the array of non-volatile memory cells is a 3D array of non-volatile memory cells and the second word line is a word line immediately above the first word line or immediately below the first word line.

* * * * *